United States Patent
Yamada et al.

(10) Patent No.: US 11,705,744 B2
(45) Date of Patent: Jul. 18, 2023

(54) BATTERY UNIT, FLAVOR INHALER, METHOD FOR CONTROLLING BATTERY UNIT, AND PROGRAM FOR DETECTING DEGRADATION OF A CHARGEABLE AND DISCHARGEABLE POWER SUPPLY OF A BATTERY UNIT OF A VAPORIZOR

(71) Applicant: JAPAN TOBACCO INC., Tokyo (JP)

(72) Inventors: Manabu Yamada, Tokyo (JP); Takeshi Akao, Tokyo (JP)

(73) Assignee: JAPAN TOBACCO INC., Tokyo (JP)

( * ) Notice: Subject to any disclaimer, the term of this patent is extended or adjusted under 35 U.S.C. 154(b) by 433 days.

(21) Appl. No.: 16/851,137

(22) Filed: Apr. 17, 2020

(65) Prior Publication Data

US 2020/0237015 A1 Jul. 30, 2020

Related U.S. Application Data

(63) Continuation of application No. PCT/JP2017/037757, filed on Oct. 18, 2017.

(51) Int. Cl.
| | |
|---|---|
| H02J 7/00 | (2006.01) |
| G01R 31/392 | (2019.01) |
| G01R 31/3835 | (2019.01) |
| A24F 40/40 | (2020.01) |
| A24F 40/51 | (2020.01) |

(Continued)

(52) U.S. Cl.
CPC .......... *H02J 7/0036* (2013.01); *A24F 40/40* (2020.01); *A24F 40/50* (2020.01); *A24F 40/51* (2020.01); *A24F 40/60* (2020.01); *A24F 40/90* (2020.01); *G01R 31/3644* (2013.01); *G01R 31/3835* (2019.01); *G01R 31/392* (2019.01); *H01M 10/44* (2013.01); *H01M 10/48* (2013.01); *H02J 7/00* (2013.01); *H01M 2220/30* (2013.01)

(58) Field of Classification Search
CPC ...... H02J 7/00; G01R 31/3644; H01M 10/44; H01M 10/48; H01M 2220/30
USPC .......................................... 320/134; 131/330
See application file for complete search history.

(56) References Cited

U.S. PATENT DOCUMENTS

| | | | |
|---|---|---|---|
| 9,178,380 B2 | 11/2015 | Kawai et al. | |
| 2005/0017687 A1* | 1/2005 | Nagaoka | ............... H02J 7/0047 320/132 |

(Continued)

FOREIGN PATENT DOCUMENTS

| | | |
|---|---|---|
| CN | 1956287 A | 5/2007 |
| CN | 104770884 A | 7/2015 |

(Continued)

OTHER PUBLICATIONS

Extended European Search Report dated Aug. 5, 2020 in European Application No. 17929280.0.

(Continued)

*Primary Examiner* — Nathaniel R Pelton
(74) *Attorney, Agent, or Firm* — Xsensus LLP

(57) ABSTRACT

A battery unit for a favor inhaler includes a chargeable and dischargeable power supply, a connection part capable of electrically connecting to an external charger, and a controller configured to perform control regarding at least the power supply, wherein when an accumulated value of a connection time period to the charger exceeds a first predetermined time period, the controller determines that the power supply has been degraded.

10 Claims, 15 Drawing Sheets

(51) Int. Cl.

| | |
|---|---|
| *G01R 31/36* | (2020.01) |
| *H01M 10/44* | (2006.01) |
| *H01M 10/48* | (2006.01) |
| *A24F 40/50* | (2020.01) |
| *A24F 40/60* | (2020.01) |
| *A24F 40/90* | (2020.01) |

(56) References Cited

U.S. PATENT DOCUMENTS

| | | | |
|---|---|---|---|
| 2007/0013344 A1* | 1/2007 | Aradachi | G01R 31/392 320/132 |
| 2013/0335013 A1 | 12/2013 | Suzuki et al. | |
| 2016/0036096 A1* | 2/2016 | Yoshida | H01M 10/63 429/61 |
| 2017/0013879 A1* | 1/2017 | Frisbee | A61M 11/042 |
| 2017/0027234 A1 | 2/2017 | Farine et al. | |
| 2017/0214261 A1* | 7/2017 | Gratton | A24F 15/18 |
| 2017/0238606 A1 | 8/2017 | Matsumoto et al. | |
| 2017/0292998 A1* | 10/2017 | Vidhi | G01R 31/3648 |
| 2021/0132159 A1* | 5/2021 | Oki | H02J 7/345 |

FOREIGN PATENT DOCUMENTS

| | | |
|---|---|---|
| CN | 106932726 A | 7/2017 |
| GB | 2528712 A | 2/2016 |
| JP | 09-28044 A | 1/1997 |
| JP | 10-178747 A | 6/1998 |
| JP | 2002-352865 A | 12/2002 |
| JP | 2004-288537 A | 10/2004 |
| JP | 2007-024541 A | 2/2007 |
| JP | 2007-336778 A | 12/2007 |
| JP | 2012-183611 A | 9/2012 |
| JP | 2013-186956 A | 9/2013 |
| JP | 2015-85528 A | 5/2015 |
| JP | 2016-100995 A | 5/2016 |
| JP | 2016-119249 A | 6/2016 |
| JP | 2017-514463 A | 6/2017 |
| WO | 2014/141834 A1 | 9/2014 |
| WO | 2016/119626 A1 | 8/2016 |
| WO | 2017/015042 A1 | 1/2017 |

OTHER PUBLICATIONS

Extended European search report dated May 3, 2021, in corresponding European patent Application No. 17929326.1, 11 pages.
Japanese Notice of Reasons for Refusal dated Mar. 12, 2021 in Japanese Application No. 2019-549060.
International Search Report and Written Opinion dated Jan. 23, 2018 for PCT/JP2017/037757 filed on Oct. 18, 2017, 9 pages including English Translation of the International Search Report.
International Search Report and Written Opinion dated Dec. 19, 2017 for PCT/JP2017/037759 filed on Oct. 18, 2017, 8 pages including English Translation of the International Search Report.
Korean Office Action dated Sep. 30, 2021 in corresponding Korean patent Application No. 10-2020-7010783.
Office Action dated Oct. 15, 2020, in corresponding Russian patent Application No. 2020115808, 18 pages.
Office Action dated Oct. 28, 2020, in corresponding Japanese patent Application No. 2019-549059, 8 pages.
Office Action dated Jul. 7, 2020, in corresponding Japanese patent Application No. 2019-549059, 8 pages.
Summons to Attend Oral Proceedings issued Dec. 2, 2021, in European Application No. 17 929 280.0.
Nurcan Keskin et al., "Double-pulse Charge Technique for Wireless and Mobile devices", Analog Integrated Circuits and Signal Processing, 86, 299-305, Nov. 26, 2015, DOI 10.1007/s10470-015-0663-3.
Chinese Office Action dated Jun. 27, 2022, in Chinese Application No. 201780096024.3.

* cited by examiner

BATTERY UNIT, FLAVOR INHALER, METHOD FOR CONTROLLING BATTERY UNIT, AND PROGRAM FOR DETECTING DEGRADATION OF A CHARGEABLE AND DISCHARGEABLE POWER SUPPLY OF A BATTERY UNIT OF A VAPORIZOR

CROSS REFERENCE TO RELATED APPLICATION

The present application is a continuation application of International Application No. PCT/JP2017/037757, filed on Oct. 18, 2017.

TECHNICAL FIELD

The present invention relates to a battery unit for a non-combustion-type flavor inhaler, a flavor inhaler including the battery unit, a method of controlling the battery unit, and a program for executing the method.

BACKGROUND ART

Instead of a cigarette, there has been proposed a non-combustion-type flavor inhaler such as an electronic cigarette, for example, used for inhaling flavor without combustion (PTLs 1 and 2). The non-combustion-type flavor inhaler (hereinafter simply referred to as a flavor inhaler) includes at least one of an aerosol source and a flavor source, a heater configured to vaporize or atomize inhaling taste components contained in at least one of the aerosol source and the flavor source, a power supply configured to supply electric power to the heater, and a controller configured to control the heater and the power supply. The power supply configured to supply electric power to the heater is typically a chargeable and dischargeable secondary battery.

The following PTL 1 discloses that the life of a secondary battery is determined based on a charge cycle count of the secondary battery, the number of times that the secondary battery has been charged, a capacity reduction rate of the battery, or elapsed time. In the technique disclosed in PTL 1, when the secondary battery has reached its end of life, the controller in a battery pack may notify an electronic device that the secondary battery has reached its end of life through the communication terminal, and suspend use of the secondary battery.

The following PTL 2 discloses that a temperature sensor determines whether the secondary battery is in a temperature environment in which the secondary battery is chargeable. In the technique disclosed in PTL 2, charging the secondary battery is suspended based on the result of determination.

CITATION LIST

Patent Literature

PTL 1: International Publication No. WO 2014/141834
PTL 2: Japanese Patent Laid-Open No. 2015-85528

SUMMARY OF INVENTION

A first feature provides a battery unit for a favor inhaler including a chargeable and dischargeable power supply, a connection part capable of electrically connecting to an external charger, and a controller configured to perform control regarding at least the power supply, wherein when an accumulated value of a connection time period to the charger exceeds a first predetermined time period, the controller determines that the power supply has been degraded.

Here, the connection time period to the charger means a time period during which the controller of the battery unit determines that the power supply and the charger are electrically connected to each other. That is, it should be noted that the connection time period to the charger differs from the entire period during which the battery unit and the charger are physically connected to each other.

The second feature provides the battery unit according to the first feature, wherein the controller is configured to periodically stop charging to the power supply, and the controller measures the accumulated value of the connection time period to the charger without including a time period during which charging is periodically stopped.

The third feature provides the battery unit according to the first feature or the second feature, wherein the controller stops a count of the accumulated value of the connection time period when a time period from a charging start of the power supply exceeds a second predetermined time period.

The fourth feature provides the battery unit according to any one of the first feature to the third feature further including a switch configured to electrically connect or disconnect between the charger and the power supply that are connected to the connection part, wherein the controller is configured to count the accumulated value of the connection time period to the charger while the switch is in an on state.

The fifth feature provides the battery unit according to any one of the first feature to the fourth feature, wherein the connection part has a pair of electrical terminals, and at least one of the pair of electrical terminals also serves as a terminal for detecting connection of the charger.

The sixth feature provides the battery unit according to any one of the first feature to the fifth feature, wherein the connection part is configured to be electrically connectable to a load configured to vaporize or atomize an aerosol source or a flavor source.

The seventh feature provides the battery unit according to any one of the first feature to the sixth feature further including a notification part that emits light, sound or vibration when the accumulated value of the connection time period to the charger exceeds the first predetermined time period.

The eighth feature provides the battery unit according to any one of the first feature to the seventh feature further including a notification part that emits light, sound or vibration, wherein the notification part emits a first pattern of light, sound or vibration when the accumulated value of the connection time period to the charger exceeds the first predetermined time period, the notification part emits a second pattern of light, sound or vibration when a time period from a charging start of the power supply exceeds a second predetermined time period, and the second pattern differs from the first pattern.

The ninth feature provides a flavor inhaler including the battery unit according to any one of the first feature to the eighth feature, and a load configured to be electrically connectable to the power supply of the battery unit and to vaporize or atomize an aerosol source or a flavor source.

The tenth feature provides a charger configured to be connectable to the battery unit according to any one of the first feature to the eighth feature.

The eleventh feature provides a method including the steps of measuring an accumulated value of a connection time period of a chargeable and dischargeable power supply provided in a battery unit for a flavor inhaler to a charger, and determining that the power supply has been degraded when the accumulated value of the connection time period exceeds a first predetermined time period.

The twelfth feature provides a program causing a battery unit to execute the method according to the eleventh feature.

DESCRIPTION OF EMBODIMENTS

Hereinafter, embodiments will be described. Note that the same or similar parts are denoted by the same or similar reference signs in the description of the drawings below. However, it should be noted that the drawings are schematic and ratios and the like in dimensions may be different from actual ones.

Therefore, specific dimensions and the like should be determined with reference to the following description. Moreover, it is a matter of course that parts having different dimensional relationships and ratios may be included between the mutual drawings.

Outline of Disclosure

As disclosed in PTLs 1 and 2, there are known various types of control regarding the charge and/or discharge of the secondary battery. However, the flavor inhaler may include an electrical circuit having no communication terminal, no temperature sensor and the like, to achieve the miniaturization. From this point of view, the techniques disclosed in PTLs 1 and 2 cannot be applied as is to the flavor inhaler in some cases. Accordingly, there still remains room for improvement in control regarding the charge and discharge of the secondary battery in the flavor inhaler.

A battery unit for a flavor inhaler according to one aspect includes a chargeable and dischargeable power supply, a connection part capable of electrically connecting to an external charger, and a controller configured to perform control regarding at least the power supply. When an accumulated value of a connection time period to the charger exceeds a first predetermined time period, the controller determines that the power supply has been degraded.

A method according to one aspect includes the steps of measuring an accumulated value of a connection time period of a chargeable and dischargeable power supply provided in a battery unit for a flavor inhaler to a charger, and determining that the power supply has been degraded when the accumulated value of the connection time period exceeds a first predetermined time period.

In the above-described aspect, the accumulated value of the connection time period to the charger is used to determine the degradation of the power supply. The accumulated value of the connection time period to the charger can be measured by the controller provided in the battery unit. Accordingly, the degradation of the power supply according to the above-described aspect can be determined without information (a state of the power supply and the like) acquired by the charger side being transmitted to the controller in the battery unit through the communication terminal.

Such a method of determining the degradation of the power supply can be preferably applied particularly to a small-sized and portable flavor inhaler including an electrical circuit with a simple configuration.

(Flavor Inhaler)

Figure 1:
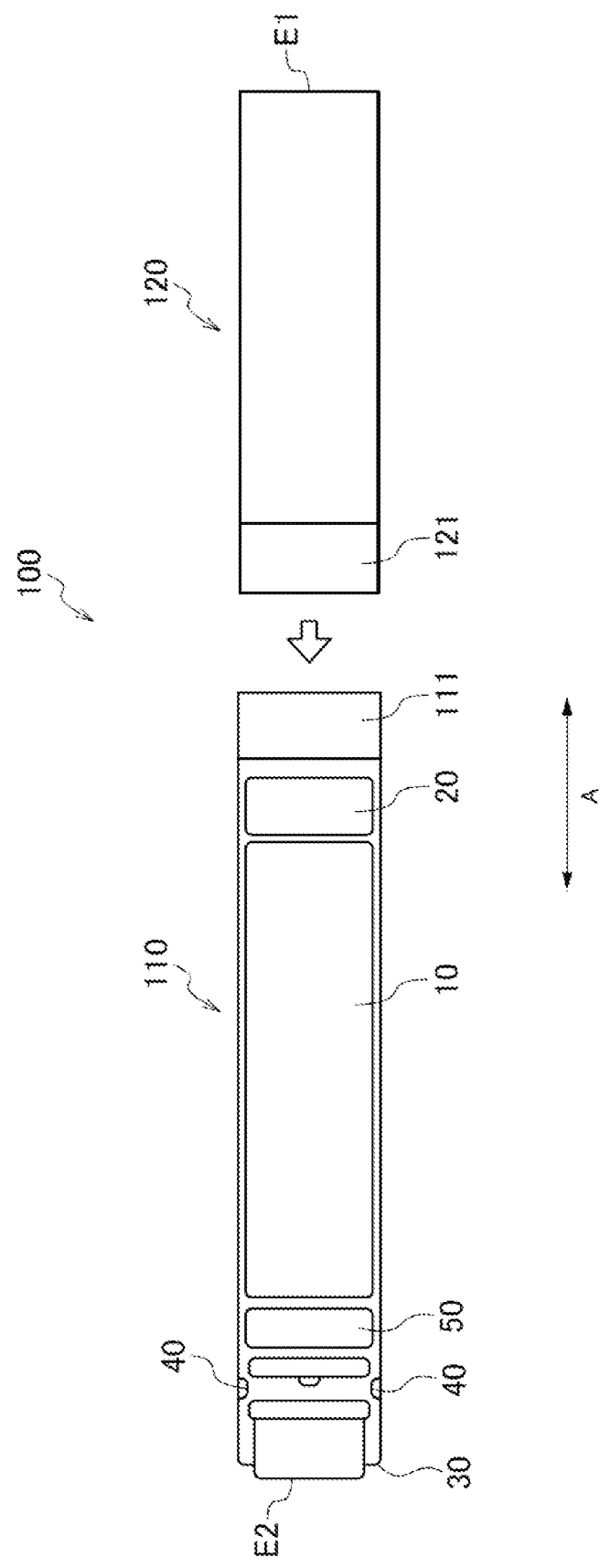
FIG. 1 is an exploded view illustrating a flavor inhaler according to one embodiment.
Figure 2:
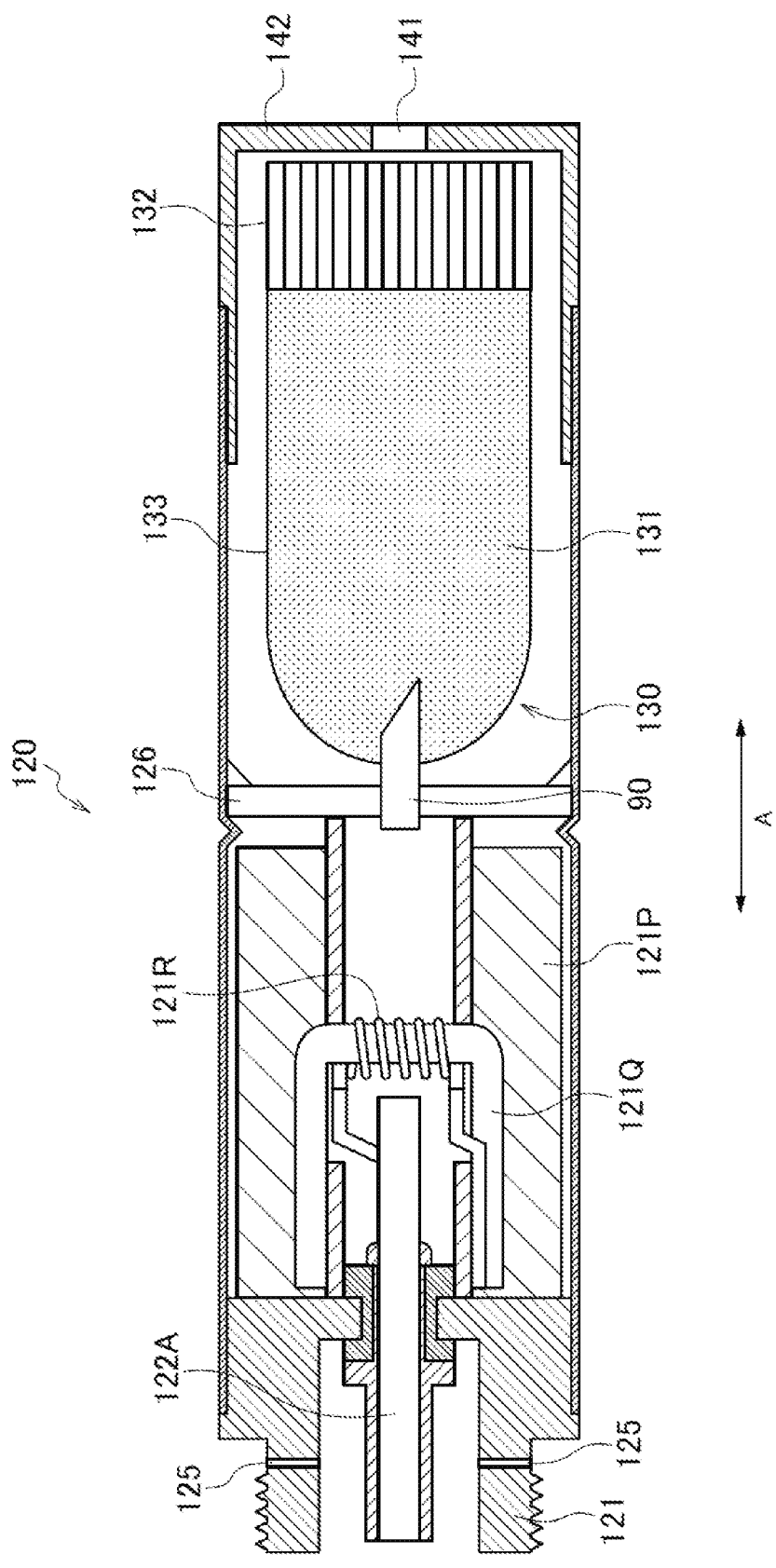
FIG. 2 is a diagram illustrating an atomizing unit according to one embodiment.
Figure 3:
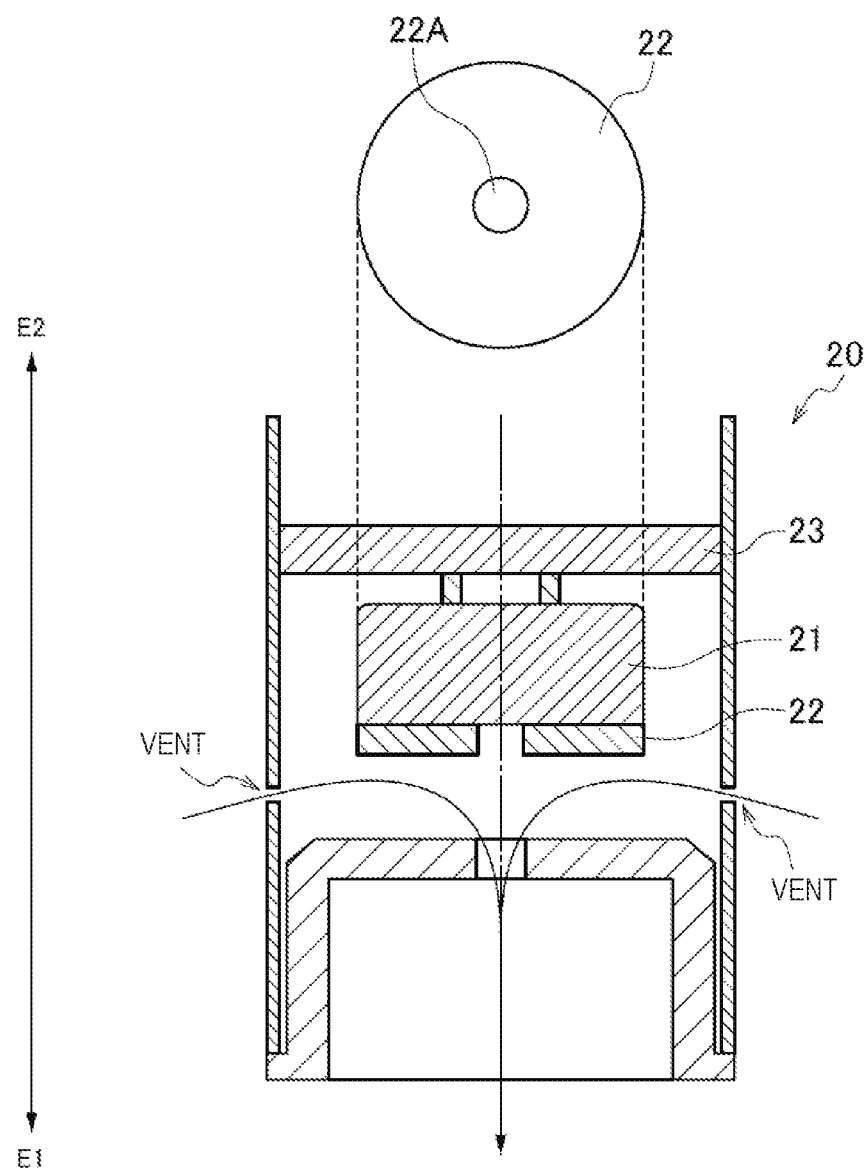
FIG. 3 is a schematic diagram illustrating an example of a configuration of an inhalation sensor according to one embodiment.
Figure 4:
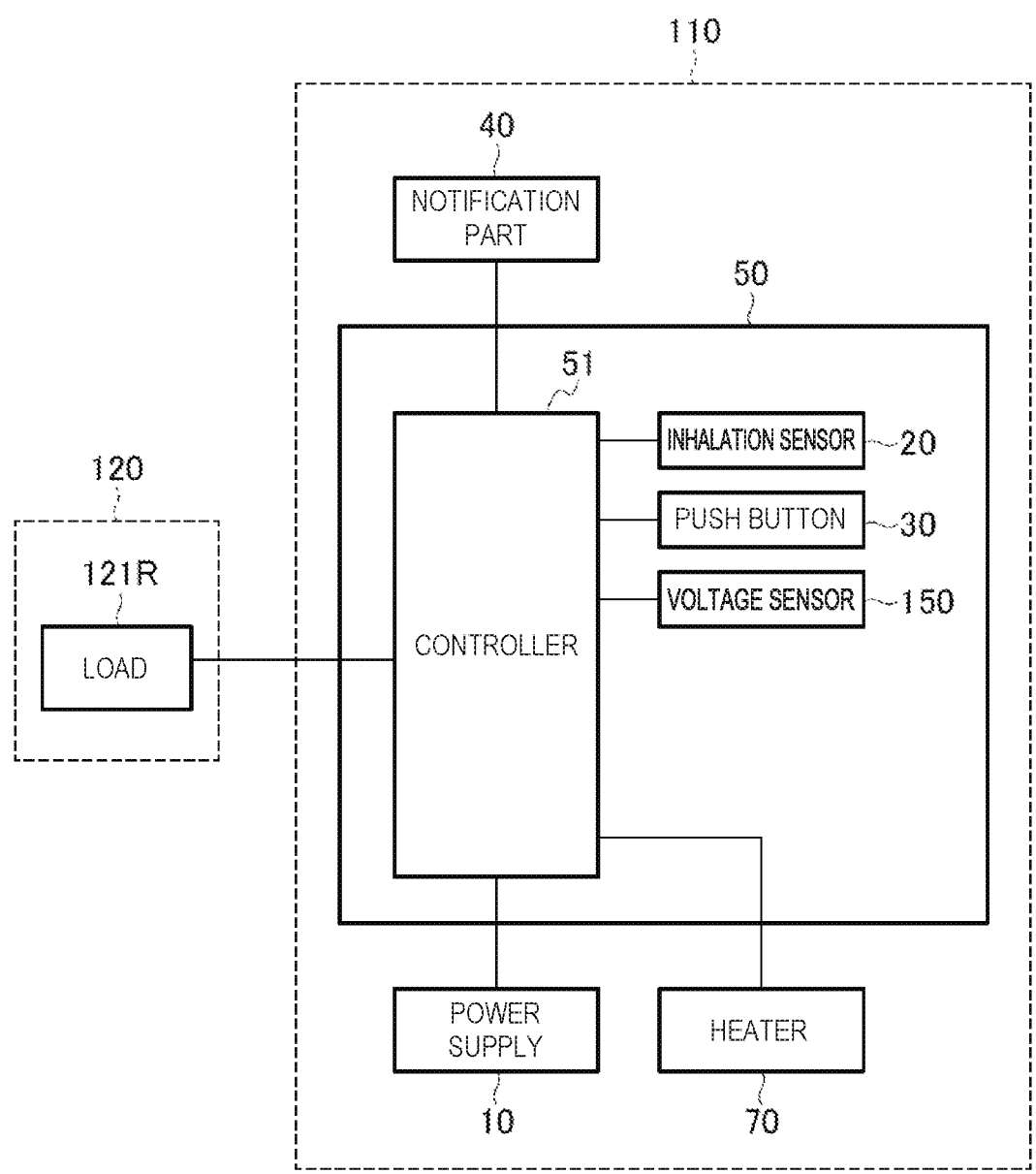
FIG. 4 is a block diagram of the flavor inhaler.
Figure 5:
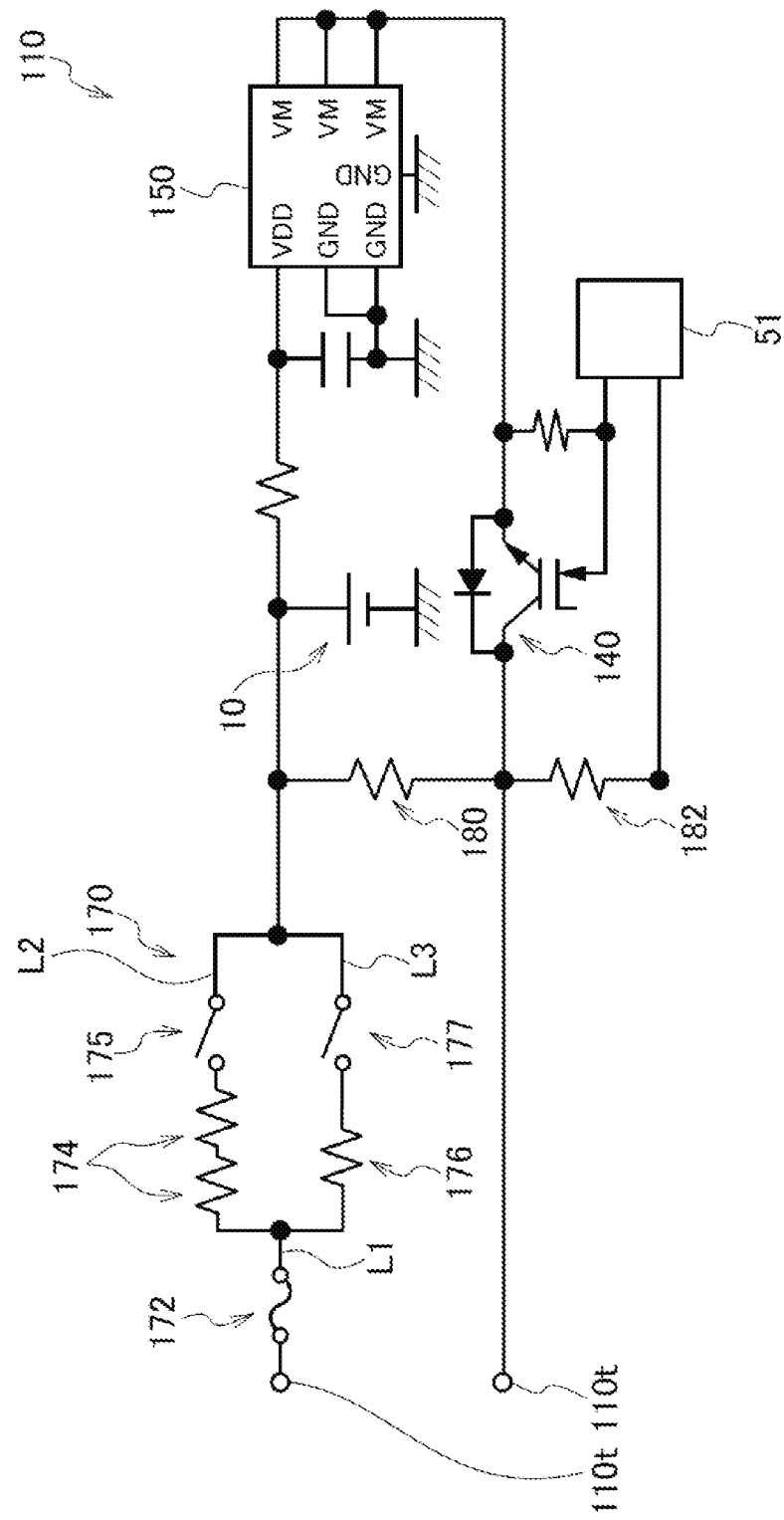
FIG. 5 is a diagram illustrating an electrical circuit provided in a battery unit.
Figure 6:
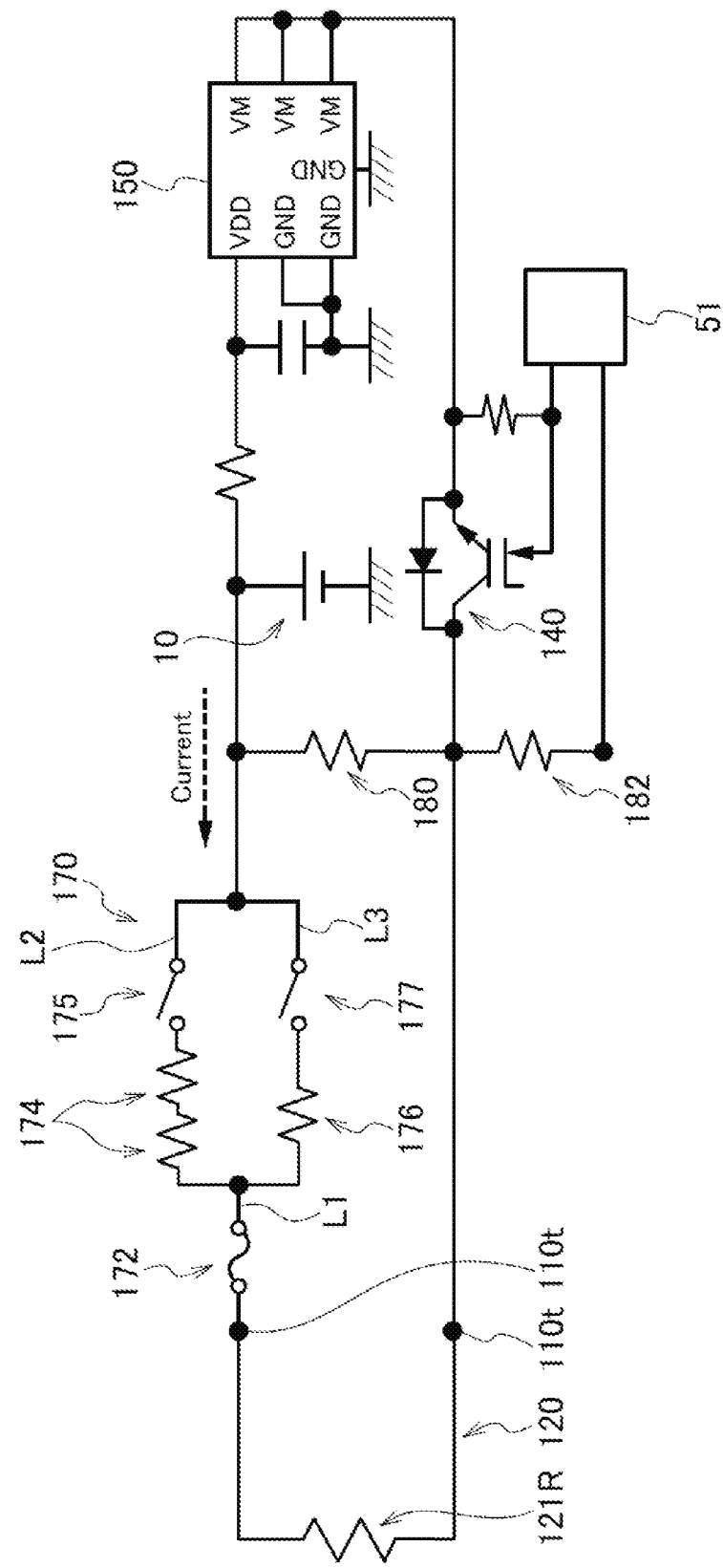
FIG. 6 is a diagram illustrating an electrical circuit of an atomizing unit and the battery unit in a state in which a load is connected.
Figure 7:
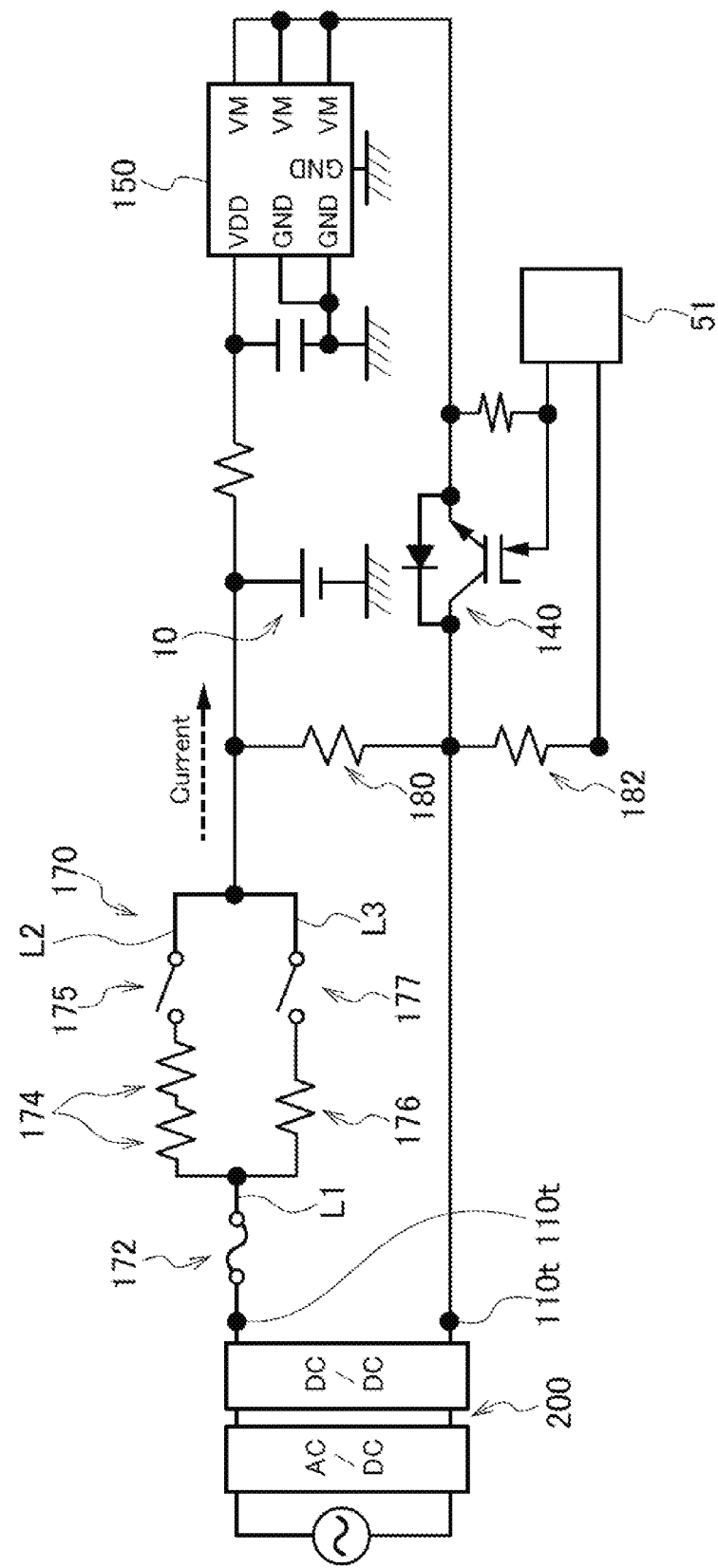
FIG. 7 is a diagram illustrating an electrical circuit of a charger and the battery unit in a state in which the charger is connected.

Hereinafter, a flavor inhaler according to one embodiment will be described. FIG. 1 is an exploded view illustrating a flavor inhaler according to one embodiment. FIG. 2 is a diagram illustrating an atomizing unit according to one embodiment. FIG. 3 is a schematic diagram illustrating an example of a configuration of an inhalation sensor according to one embodiment. FIG. 4 is a block diagram illustrating an electric configuration of the flavor inhaler. FIG. 5 is a diagram illustrating an electrical circuit of a battery unit. FIG. 6 is a diagram illustrating an electrical circuit of the atomizing unit and the battery unit in a state in which a load is connected. FIG. 7 is a diagram illustrating an electrical circuit of a charger and the battery unit in a state in which the charger is connected.

A flavor inhaler 100 may be a non-combustion-type flavor inhaler for inhaling an inhalation component (an inhaling flavor component) without combustion. The flavor inhaler 100 may have a shape extending along a predetermined direction A which is a direction from a non-inhalation port end E2 toward an inhalation port end E1. In this case, the flavor inhaler 100 may include one end E1 having an inhalation port 141 for inhaling an inhalation component and the other end E2 opposite to the inhalation port 141.

The flavor inhaler 100 may include a battery unit 110 and an atomizing unit 120. The atomizing unit 120 may be configured to be detachably attached to the battery unit 110 through mechanical connection parts 111 and 121. When the atomizing unit 120 and the battery unit 110 are mechanically connected to each other, a load 121R (described later) in the atomizing unit 120 is electrically connected to a power supply 10 provided in the battery unit 110 through an electrical connection terminal 110t. That is, the electrical connection terminal 110t forms a connection part capable of electrically disconnecting and connecting the load 121R from/to the power supply 10.

The atomizing unit 120 includes an inhalation component source to be inhaled by a user, and the load 121R configured to vaporize or atomize the inhalation component source with electric power from the power supply 10. The inhalation component source may include an aerosol source that generates aerosol and/or a flavor source that generates a flavor component.

The load 121R may be any element capable of generating aerosol and/or a flavor component from an aerosol source and/or a flavor source by receiving the electric power. The load 121R may be, for example, a heat generating element such as a heater or an element such as an ultrasound generator. Examples of the heat generating element include a heat generation resistor, a ceramic heater, and an induction heating type heater.

Hereinafter, a more detailed example of the atomizing unit 120 will be described with reference to FIG. 1 and FIG. 2. The atomizing unit 120 may include a reservoir 121P, a wick 121Q, and the load 121R. The reservoir 121P may be configured to store a liquid aerosol source or flavor source. The reservoir 121P may be, for example, a porous body made of a material such as a resin web. The wick 121Q may be a liquid holding member that draws the aerosol source or the flavor source from the reservoir 121P using capillary action. The wick 121Q may be made of, for example, glass fiber or porous ceramic.

The load 121R atomizes the aerosol source held by the wick 121Q or heats the flavor source held by the wick 121Q. The load 121R is formed of, for example, a resistive heating element (for example, a heating wire) wound around the wick 121Q.

The air that has flowed in from an inlet hole 122A passes through the vicinity of the load 121R in the atomizing unit 120. The inhalation component generated by the load 121R flows together with the air toward the inhalation port.

The aerosol source may be a liquid at ordinary temperature. For example, polyhydric alcohol may be used as the aerosol source. The aerosol source itself may contain the flavor component. Alternatively, the aerosol source may include a tobacco raw material that emits an inhaling flavor component by being heated or an extract deriving from the tobacco raw material.

Note that, although an example of the liquid aerosol source at ordinary temperature has been described in detail in the above-described embodiment, an aerosol source that is a solid at ordinary temperature may be also used instead of the liquid aerosol source. In this case, since the load 121R generates aerosol from the solid aerosol source, the load 121R may be arranged to be in contact with or in proximity to the solid aerosol source.

The atomizing unit 120 may include a replaceable flavor unit (cartridge) 130. The flavor unit 130 includes a cylindrical body 131 that accommodates the flavor source. The cylindrical body 131 may include a membrane member 133 and a filter 132. The flavor source may be provided in a space formed by the membrane member 133 and the filter 132.

The atomizing unit 120 may include a breaking part 90. The breaking part 90 is a member for breaking a part of the membrane member 133 of the flavor unit 130. The breaking part 90 may be held by a partition wall member 126 for partitioning into the atomizing unit 120 and the flavor unit 130. The partition wall member 126 is made of, for example, a polyacetal resin. The breaking part 90 is, for example, a cylindrical hollow needle. An airflow path that pneumatically communicates between the atomizing unit 120 and the flavor unit 130 is formed by puncturing the membrane member 133 with a tip of the hollow needle. Here, it is preferable that an inside of the hollow needle is provided with a mesh having a roughness of not allowing the flavor source to pass through.

According to an example of the preferred embodiment, the flavor source in the flavor unit 130 imparts the inhaling flavor component to the aerosol generated by the load 121R of the atomizing unit 120. The flavor imparted to the aerosol by the flavor source is sent to the inhalation port of the flavor inhaler 100. Thus, the flavor inhaler 100 may have a plurality of inhalation component sources. Alternatively, the flavor inhaler 100 may have only one inhalation component source.

The flavor source in the flavor unit 130 may be a solid at ordinary temperature. By way of example, the flavor source comprises an ingredient piece of a plant material which imparts the inhaling flavor component to the aerosol. Shredded tobacco or a forming body obtained by forming a tobacco material such as a tobacco raw material in a granular form, may be used as an ingredient piece which is a component of the flavor source. Alternatively, the flavor source may comprise a forming body obtained by forming a tobacco material into a sheet form. Also, the ingredient piece, which is a component of the flavor source, may comprise a plant (for example, mint, a herb, and the like) other than tobacco. The flavor source may be provided with flavor such as menthol.

The flavor inhaler 100 may include a mouthpiece 142 having the inhalation port 141 through which a user inhales the inhalation component. The mouthpiece 142 may be configured to be detachably attached to the atomizing unit 120 or the flavor unit 130, or may be configured to be an integral part of the atomizing unit 120 or the flavor unit 130.

The battery unit 110 may include the power supply 10, a notification part 40, and a control unit 50. The power supply 10 stores the electric power necessary for the operation of the flavor inhaler 100. The power supply 10 may be detachably attached to the battery unit 110. The power supply 10 may be, for example, a rechargeable battery such as a lithium ion secondary battery.

The control unit 50 may include, for example, a controller 51 such as a microcontroller, an inhalation sensor 20, and a push button 30. In addition, the flavor inhaler 100 may include a voltage sensor 150. The controller 51 performs various types of control necessary for the operation of the flavor inhaler 100 according to the output values from the voltage sensor 150. For example, the controller 51 may constitute a power control unit that controls the electric power from the power supply 10 to the load 121.

When the atomizing unit 120 is connected to the battery unit 110, the load 121R provided in the atomizing unit 120 is electrically connected to the power supply 10 of the battery unit 110 (see FIG. 6).

The flavor inhaler 100 may include a switch 140 capable of electrically connecting and disconnecting the load 121R to or from the power supply 10. The switch 140 is opened or closed by the control unit 50. The switch 140 may be comprised of, for example, a MOSFET.

When the switch 140 is turned on, the electric power is supplied from the power supply 10 to the load 121R. On the other hand, when the switch 140 is turned off, the supply of the electric power from the power supply 10 to the load 121R is stopped. The turning on and off of the switch 140 is controlled by the control unit 50.

The control unit 50 may include a request sensor capable of outputting a signal requesting the operation of the load 121R. The request sensor may be, for example, a push button 30 to be pressed by a user, or the inhalation sensor 20 configured to detect a user's inhaling operation. The control unit 50 acquires an operation request signal to the load 121R and generates a command for operating the load 121R. In a specific example, the control unit 50 outputs the command for operating the load 121R to the switch 140, and the switch 140 is turned on according to this command. Thus, the control unit 50 is configured to control the supply of the electric power from the power supply 10 to the load 121R. When the electric power is supplied from the power supply 10 to the load 121R, the inhalation component source is vaporized or atomized by the load 121R.

The inhalation sensor 20 may be configured to output an output value that varies depending on inhalation from the inhalation port. Specifically, the inhalation sensor 20 may be a sensor that outputs a value (for example, a voltage value or a current value) that changes according to the flow rate of air (i.e., a user's puff operation) inhaled from the non-inhalation port side toward the inhalation port side. Examples of such a sensor include, for example, a condenser microphone sensor, and a known flow sensor.

FIG. 3 illustrates a specific example of the inhalation sensor 20. The inhalation sensor 20 illustrated in FIG. 3 includes a sensor body 21, a cover 22, and a substrate 23. The sensor body 21 is comprised of, for example, a capacitor. An electric capacity of the sensor body 21 changes due to vibration (pressure) generated by air inhaled from an air introduction hole 125 (i.e., air inhaled from the non-inhalation port side toward the inhalation port side). The cover 22 is provided on the inhalation port side with respect to the sensor body 21, and has an opening 22A. Providing the cover 22 having the opening 22A allows the electric capacity of the sensor body 21 to be changed easily, and improves the response characteristic of the sensor body 21. The substrate 23 outputs a value (here, a voltage value) indicating the electric capacity of the sensor body 21 (capacitor).

The flavor inhaler 100, more specifically, the battery unit 110 may be configured to be connectable to the charger 200 for charging the power supply 10 in the battery unit 110 (see FIG. 7). When the charger 200 is connected to the battery unit 110, the charger 200 is electrically connected to the power supply 10 of the battery unit 110.

A pair of electrical terminals 110t of the battery unit 110 for electrically connecting the charger 200 can also serve as a pair of electrical terminals of the battery unit 110 for electrically connecting the load 121R. That is, the charger 200 and the atomizing unit 120 may be electrically connected to the same electrical terminal 110t of the battery unit.

To simplify the structure of the flavor inhaler 100, the charger 200 may be configured to be incapable of communicating with the control unit 50 of the battery unit 110. That is, a communication terminal for communicating between the processor 250 of the charger 200 and the control unit 50 is unnecessary.

The battery unit 110 may include a determination part configured to determine whether the charger 200 is connected. The determination part may be, for example, means for determining the presence or absence of connection of the charger 200 based on a change in potential difference between a pair of electrical terminals 110t to which the charger 200 is connected.

In the present embodiment, the determination part may include a pair of electrical resistors 180 and 182 that are arranged in series. One electrical resistor 180 of the pair of electrical resistors is provided at a position where the electrical terminals 110t are connected to each other. The other electrical resistor 182 of the pair of electrical resistors is connected to one terminal of the controller 51.

The pair of electrical resistors 180 and 182 may have a known electrical resistance value. The electrical resistance value of the pair of electrical resistors 180 and 182 is sufficiently larger than that of the load 121R, and may be, for example, 10 k$\Omega$.

A potential at a point between the pair of electrical resistors 180 and 182 in a state in which nothing is connected to the electrical terminals 110t differs from that in a state in which the charger 200 is connected to the electrical terminals 110t. Accordingly, when the controller 51 can estimate whether the connection parts 110t are in a state of being connected with nothing or in a state of being connected with the charger 200, based on a signal (hereinafter, referred to as a "WAKE signal") received from the other electrical resistor 182 of the pair of electrical resistors.

The determination part for determining the connection of the charger 200 is not limited to the above-described means, and may be any means that can determine the presence or absence of the connection of the charger 200. Preferably, as described above, at least one of the pair of electrical terminals 110t can also serve as a terminal for detecting connection of the charger 200.

The battery unit 110 may include a disconnection means 170 for at least temporarily disabling the electrical connection between the power supply 10 and the load 121R. The disconnection means 170 may be provided between the power supply 10 and the electrical terminal 110t in the electrical circuit of the battery unit 110.

The disconnection means 170 is preferably configured to be switchable between a first mode in which the supply of electric power from the power supply 10 to the load 121R is temporarily disabled so that the controller 51 can resume the supply of electric power and a second mode in which the supply of electric power from the power supply 10 to the load 121R is irreversibly disabled so that the controller 51 cannot resume the supply of electric power. The controller 51 may be configured to be capable of controlling the disconnection means 170 for switching between the first mode and the second mode.

As an example of a specific configuration, the disconnection means 170 may include a fuse 172. The disconnection means 170 may be configured in which a normal line L2 and an abnormal line L3 branch from a line L1 provided with the fuse 172 to be arranged in parallel to each other. In the normal line L2, a first electrical resistor 174 and a first switch 175 may be connected in series to each other. In the abnormal line L3, a second electrical resistor 176 and a second switch 177 may be connected in series to each other.

When both of the first switch 175 and the second switch 177 are turned off, the electric power cannot be supplied from the power supply 10 to the load 121R, and the power supply 10 cannot be charged by the charger 200. During the normal operation, that is, while the abnormal circumstance does not occur, the first switch 175 is on and the second switch 177 is off. In this way, the load 121R or the charger 200 that is connected to the connection parts 110t is connected to the power supply 10 through the normal line L2.

In the first mode, both of the first switch 175 and the second switch 177 are off. This temporarily disables the electrical connection between the power supply 10 and the load 121R or the charger 200.

In the second mode, both of the first switch 175 and the second switch 177 are on. Hereby, the current flows in both of the normal line L2 and the abnormal line L3, and the current that is larger than that during the normal operation flows in the fuse 172, whereby the fuse 172 is blown. When the fuse 172 is blown, the electrical connection between the power supply 10 and the load 121R or the charger 200 is irreversibly disabled.

Note that it is sufficient that the resistance value of the first electrical resistor 174 and the resistance value of the second electrical resistor 176 are set so that the fuse 172 is not blown in the first mode and the fuse 172 is blown in the second mode. The abnormal line L3 may be a so-called short-circuit line that does not include the second resistor 176 and has only conductive wire resistance of the lead wire.

The notification part 40 issues notification for notifying a user of various types of information. The notification part 40 may be, for example, a light emitting element such as an LED. Instead of this, the notification part 40 may be an element that generates sound, or a vibrator.

(Power Supply Mode)

Figure 8:
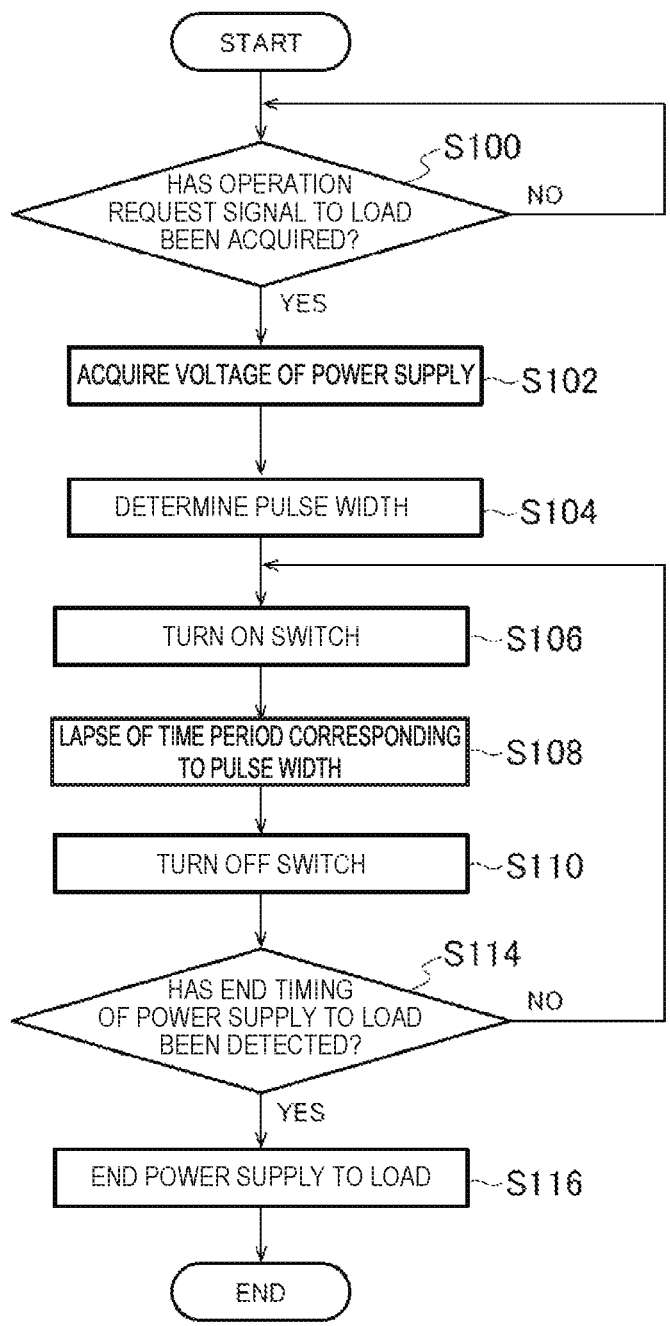
FIG. 8 is a flowchart illustrating an example of a control method in a power supply mode of the flavor inhaler.

FIG. 8 is a flowchart illustrating an example of a control method in a power supply mode of the flavor inhaler. The control flow illustrated in FIG. 8 is performed by the controller 51. The power supply mode is a mode in which electric power can be supplied from the power supply 10 to the load 121R. The power supply mode can be performed at least when the atomizing unit 120 is connected to the battery unit 110. The controller 51 may control to transition to the power supply mode when detecting that the load 121R is connected to the connection parts 110t.

The control unit 50 determines whether to have acquired the operation request signal to the load 121R in the power supply mode (step S100). The operation request signal may be a signal acquired from the inhalation sensor 20 when the inhalation sensor 20 detects the user's inhaling operation, for example. That is, it is sufficient that the control unit 50 turns on the switch 140 (step S106) when the user's inhaling operation is detected by the inhalation sensor 20. Alternatively, the operation request signal may be a signal acquired from the push button 30 when it is detected that the push button 30 has been pressed. That is, when the control unit 50 detects that the user has pressed the push button, the control unit 50 may turn on the switch 140 (step S106).

The control unit 50 acquires a voltage of the power supply 10 (step S102) before turning on the switch 140 as necessary. It is preferable that the voltage of the power supply 10 determines a pulse width (a predetermined time period) for one pulse of the electric power to be supplied to the load 121R based on the acquired electric power (step S104). Here, the pulse width may be, for example, in the range of 50 to 200 msec.

After a time period corresponding to the pulse width (the predetermined time period) has elapsed since the turning on of the switch 140 (step S108), the control unit 50 turns off the switch 140 (step S110). Hereby, the voltage is applied to the load 121R for the time period of one pulse width.

The control unit 50 determines whether to have detected an end timing of the power supply to the load 121R (step S114). When detecting the end timing, the control unit 50 ends the power supply to the load 121R (step S116).

The end timing of the power supply to the load 121R may be, for example, a timing when the inhalation sensor 20 detects the end of the operation for using the load 121R. Instead of this, the end timing of the power supply to the load 121R may be a timing when the control unit 50 detects the release of the pressing of the push button 30. Furthermore, the end timing of the power supply to the load 121R may be a timing when the control unit 50 detects that a predetermined cut-off time has elapsed since the start of the power supply to the load 121R. The predetermined cut-off time may be preset based on a period required for a general user to perform one inhaling operation. For example, the predetermined cut-off time may be in a range of 2 to 5 seconds.

If the control unit 50 does not detect the end timing of the power supply to the load 121R, the control unit 50 turns on the switch 140 again, and supplies the electric power (next power pulse) to the load 121R (steps S106, S108, and S110). By repeating the supply of electric power of one pulse to the load 121R, the control unit 50 can supply the electric power for one puff operation to the load 121R.

Figure 9:
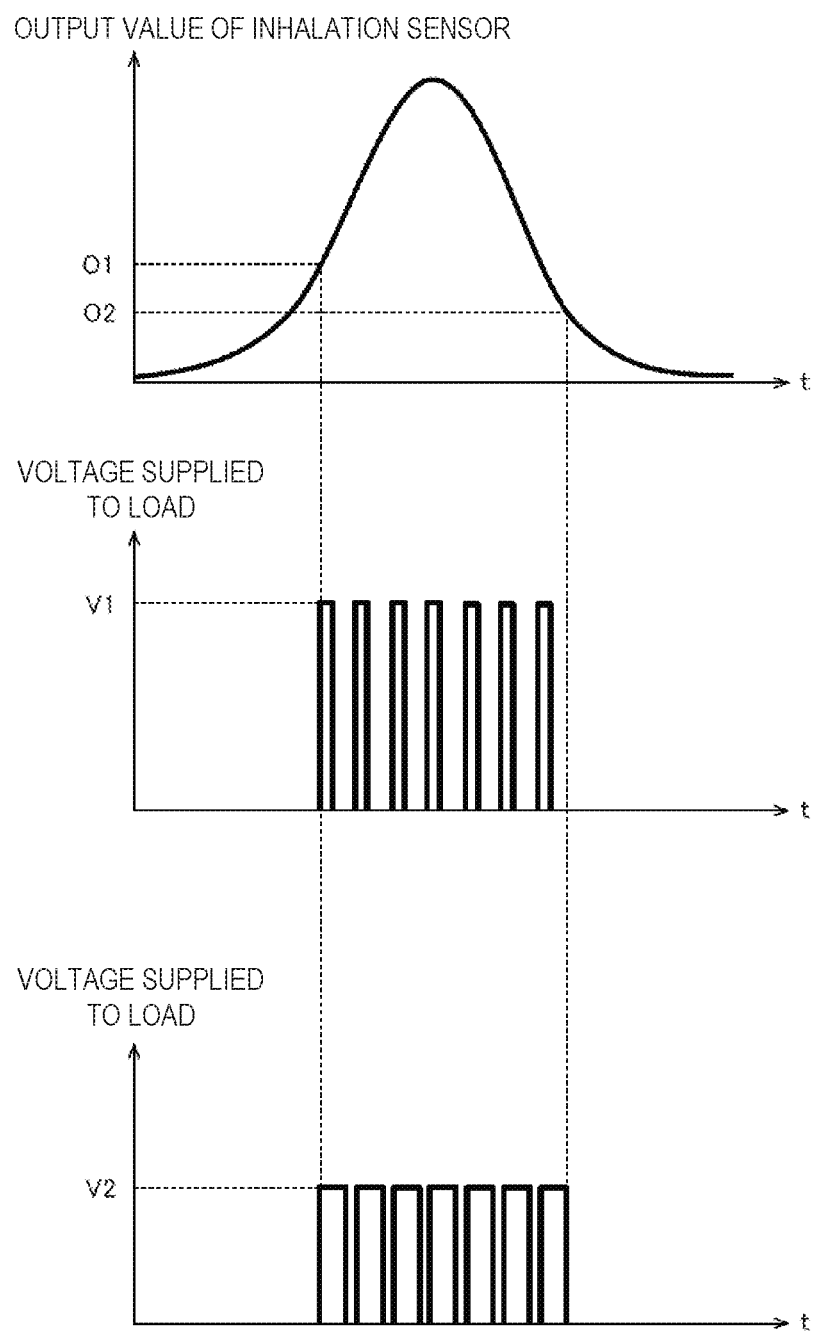
FIG. 9 is a graph showing an example of control of an amount of electric power supplied from a power supply to a load.

FIG. 9 is a graph showing an example of control of an amount of electric power supplied from the power supply 10 to the load 121R. FIG. 9 shows a relationship between an output value of the inhalation sensor 20 and a voltage to be supplied to the load 121R.

The inhalation sensor 20 may be configured to output an output value that varies depending on inhalation from the inhalation port 141. The output value of the inhalation sensor 20 may be a value according to a flow velocity (a pressure change in the flavor inhaler) of the gas in the flavor inhaler as shown in FIG. 9, but is not necessarily limited thereto.

When the inhalation sensor 20 outputs an output value that varies depending on inhalation, the control unit 50 may be configured to detect the inhalation according to the output value of the inhalation sensor 20. For example, the control unit 50 may be configured to detect the user's inhaling operation when the output value of the inhalation sensor 20 is equal to or larger than a first predetermined value O1. Accordingly, the control unit 50 may determine to have acquired the operation request signal to the load 121R when the output value of the inhalation sensor 20 has become equal to or larger than the first predetermined value O1 (step S100).

On the other hand, the control unit 50 may determine to have detected the end timing of the power supply to the load 121R when the output value of the inhalation sensor 20 has become equal to or smaller than a second predetermined value O2 (step S114). In this case, a time period from the start of the power supply to the load 121R to the end of the power supply to the load 121R may vary depending on the way in which the user performs the inhaling operation. Even in such a case, the power supply to the load 121R may be completed when the above-described predetermined cut-off time has elapsed since acquisition of the operation request signal to the load 121R.

Here, the control unit 50 may be configured to detect the inhalation only when an absolute value of the output value of the inhalation sensor 20 is equal to or larger than the first predetermined value (predetermined threshold) O1. This can prevent the load 121R from erroneously operating due to the noise of the inhalation sensor 20. In addition, the second predetermined value O2 for detecting the end timing of the power supply to the load 121R may be smaller than the first predetermined value O1.

The controller 51 may adjust the amount of electric power from the power supply 10 to be supplied to the load 121R by the pulse width control. The duty ratio relating to the pulse width may be a value smaller than 100%.

For example, when the voltage of the power supply 10 is relatively high, the controller 51 narrows the pulse width to be supplied to the load 121R (see a middle graph in FIG. 9).

For example, when the voltage value of the power supply 10 is relatively low, the controller 51 widens the pulse width to be supplied to the load 121R (see a lower graph in FIG. 9). The pulse width can be set in step S104 described above.

As described above, it is preferable that the controller 51 is configured to control the voltage to be applied to the load 121R in the pulse width modulation having a duty ratio that increases as the voltage value of the power supply 10 decreases. This enables an amount of aerosol generated during the puff operation (an amount of aerosol corresponding to electric power for one pulse) to be substantially equalized regardless of the remaining amount of the power supply 10. More preferably, the controller 51 preferably controls the duty ratio of the pulse width modulation so that an amount of electric power per pulse supplied to the load 121R becomes constant regardless of the voltage of the power supply 10.

(Charge Control by Charger)

Figure 10:
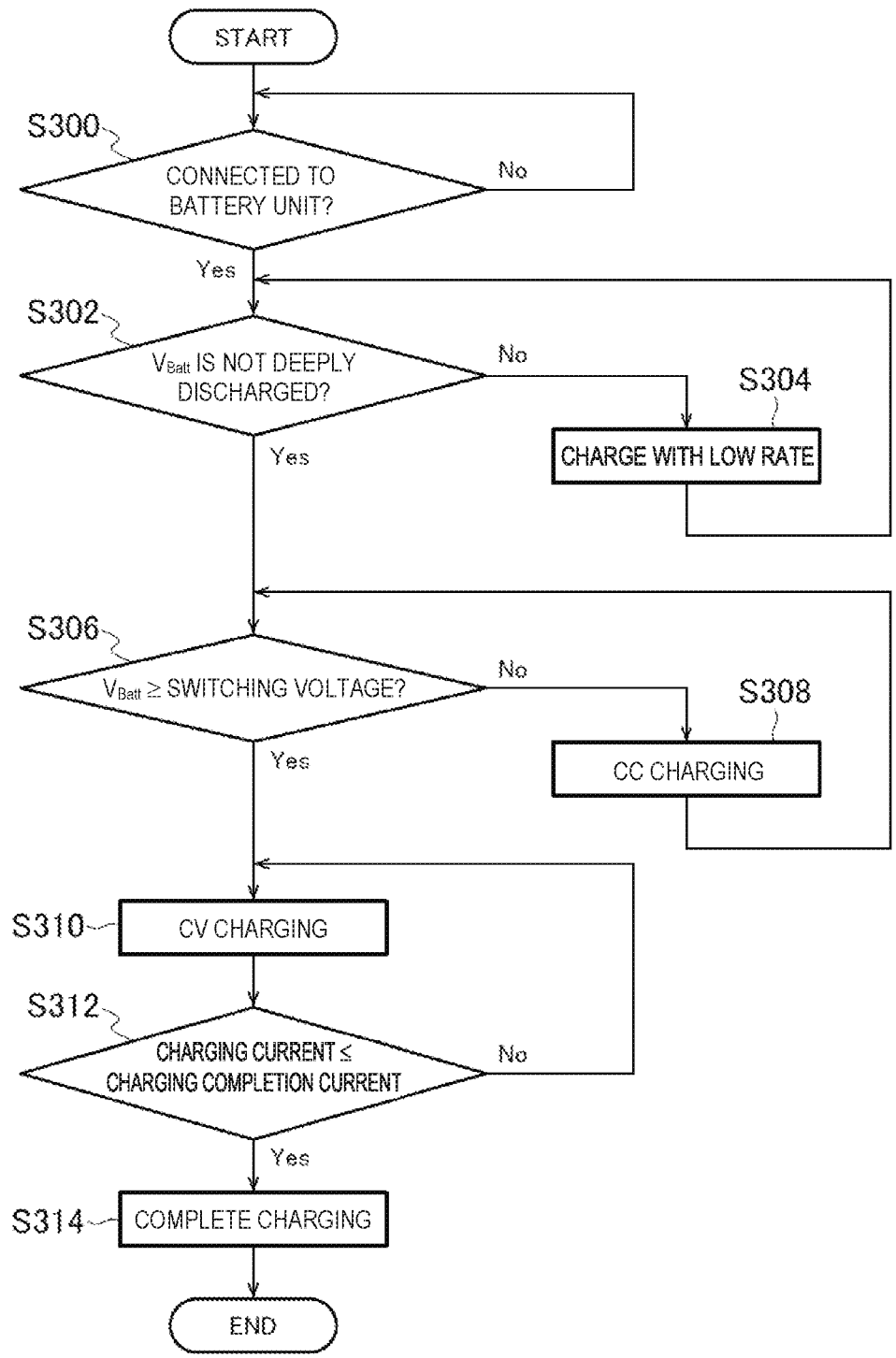
FIG. 10 is a flowchart illustrating an example of charge control by the charger.

FIG. 10 is a flowchart illustrating an example of a charge control by the charger 200. The control flow illustrated in FIG. 10 is performed by a processor mounted in the charger 200.

Firstly, the charger 200 determines whether to be connected to the battery unit 110, and waits until the charger 200 is connected to the battery unit 110 (step S300).

The connection between the charger 200 and the battery unit 110 can be detected in a known method. For example, the charger 200 can determine whether to be connected to the battery unit 110 by detecting a change in voltage between a pair of electrical terminals for connecting the charger 200 to the battery unit 110.

When the charger 200 is connected to the battery unit 110, the charger 200 determines whether the power supply 10 is deeply discharged (step S302). Here, deep discharge of the power supply 10 means a state in which the voltage of the power supply 10 is lower than the deep discharge determination voltage lower than a discharge termination voltage. The deep discharge determination voltage may be, for example, in the range of 3.1 V to 3.2 V.

The charger 200 can estimate the voltage of the power supply 10 by means of a voltmeter provided in the charger 200. The charger 200 can determine whether the power supply 10 is deeply discharged by comparing the estimated value of the voltage of the power supply 10 with the deep discharge determination voltage.

When the charger 200 determines that the power supply 10 is deeply discharged, the charger 200 charges the power supply 10 with low-rate power (step S304). As a result, the charger 200 can recover the power supply 10 from the deeply discharged state to a state of a voltage higher than the discharge termination voltage.

When the voltage of the power supply 10 is equal to or higher than the discharge termination voltage, the charger 200 determines whether the voltage of the power supply 10 is equal to or higher than the switching voltage (step S306). The switching voltage is a threshold for dividing into a section of constant current charging (CC charging) and a section of constant voltage charging (CV charging). The switching voltage may be, for example, in the range of 4.0 V to 4.1 V.

When the voltage of the power supply 10 is lower than the switching voltage, the charger 200 charges the power supply 10 by a constant current charging method (step S308). When the voltage of the power supply 10 is equal to or higher than the switching voltage, the charger 200 charges the power supply 10 by a constant voltage charging method (step S310). In the constant voltage charging method, charging proceeds and the charging current decreases.

When charging of the power supply 10 is started by the constant voltage charging method, the charger 200 determines whether the charging current is equal to or smaller than a predetermined charging completion current (step S312). Here, the charging current can be acquired by an ammeter provided in the charger 200. When the charging current is larger than the predetermined charging completion current, charging of the power supply 10 is continued by the constant voltage charging method.

When the charging current is equal to or smaller than the predetermined charging completion current, the charger 200 determines that the power supply 10 is fully charged, and stops the charging (step S314).

(Control 1 by Control Unit in Charging Mode)

Figure 11:
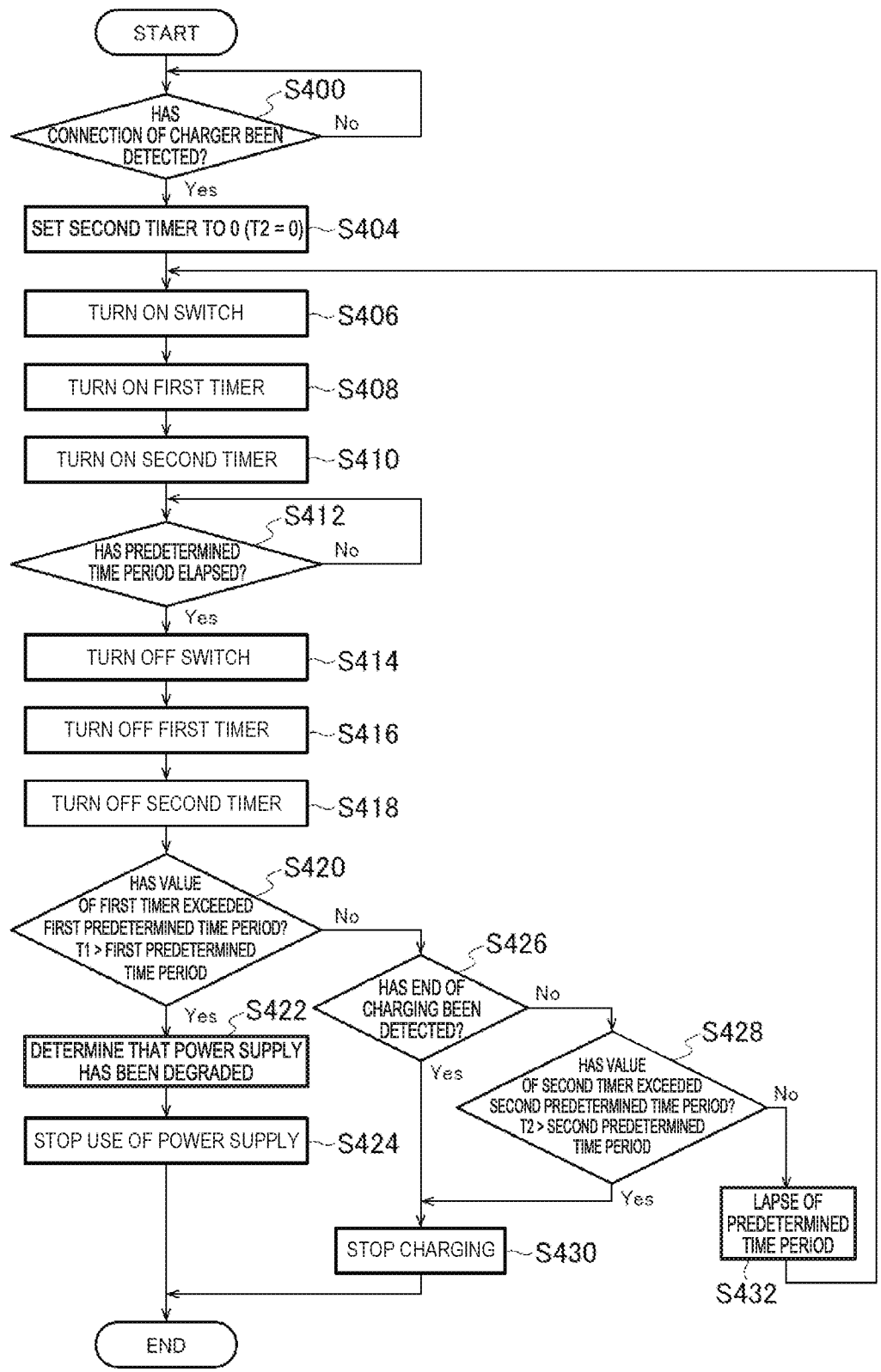
FIG. 11 is a flowchart illustrating an example of a control method by a controller in a charging mode.

FIG. 11 is a flowchart illustrating an example of a control method by the controller in a charging mode. The charging mode is a mode in which the power supply 10 can be charged. In the flowchart according to the present example, the controller 51 performs a process of determining the degradation of the power supply 10 using the accumulated value of the connection time period to the charger.

Firstly, the controller 51 detects the connection of the charger 200 to the battery unit 110 (step S400). The connection of the charger 200 to the battery unit 110 can be detected by acquiring a change in voltage between the pair of electrical terminals 110t, as described above.

When the controller 51 detects the connection of the charger 200 to the battery unit 110, a second timer is set to "0" (step S404). The second timer measures the connection time period to the charger 200 regarding one charge operation.

Next, the controller 51 turns on the switch 140 (step S406). Thus, the charger 200 and the power supply 10 are electrically connected to each other. Accordingly, the charging of the power supply 10 is started. When the controller 51 turns on the switch 140, the controller 51 turns on a first timer and the second timer (step S408 and step S410). Measurement values of the first timer and the second timer start to increase.

The first timer measures an accumulated value of the connection time period to the charger. Accordingly, the first timer is set to "0" in a new battery unit. The first timer may be configured to reset to "0" at a timing at which the power supply 10 is replaced. That is, the first timer may be configured to measure the accumulated value of the connection time period to the charger 200, regarding a certain power supply 10.

When a predetermined time period has elapsed since turning on of the switch 140, the controller 51 turns off the switch (steps S412 and S414). The length of the elapsed predetermined time period is not limited to a particular length, but may be, for example, 80 msec to 120 msec.

When the controller 51 turns off the switch 140, it is preferable that the controller 51 stops the first timer and the second timer (steps S416 and S418). That is, it is preferable that the first timer and the second timer are stopped while the power supply 10 and the charger 200 are electrically disconnected from each other in the battery unit.

The controller 51 determines whether a value of the first timer exceeds a first predetermined time period (step S420). The first predetermined time period may be a preset time period depending on the design of the battery unit. Specifically, the first predetermined time period may be set based on a charging time period determined that the battery unit should be degraded. In the present embodiment the first predetermined time period may be, for example, 500 to 1000 hours.

When the value of the first timer exceeds the first predetermined time period, the controller 51 determines that the power supply 10 has been degraded (step S422). That is, when the accumulated value of the connection time period to the charger 200 exceeds the first predetermined time period, the controller 51 determines that the power supply 10 has been degraded. When the controller 51 determines that the power supply 10 has been degraded, it is preferable that the controller 51 stops the use of the power supply 10 (step S424). For example, when the accumulated value of the connection time period to the charger 200 exceeds the first predetermined time period, the controller 51 turns off the switch 140 even when the charger 200 is attached to the battery unit 110, thereby maintaining a state in which the charging is forcibly stopped. This can prevent the power supply 10 determined to be degraded from being further charged 10.

Furthermore, when the accumulated value of the connection time period to the charger 200 exceeds the first predetermined time period, the controller 51 may switch the disconnection means 170 to the second mode to blow the fuse 172. Thus, since the electrical connection between the charger 200 or the load 121R and the power supply 10 is irreversibly disabled, the use of the degraded power supply 10 can be certainly inhibited.

Furthermore, when the controller 51 determines that the power supply 10 has been degraded, the controller 51 may notify the user that the power supply 10 has been degraded by light, sound or vibration emitted from the notification part 40. It is preferable that a pattern of light, sound or vibration emitted from the notification part 40 to notify that the power supply 10 has been degraded differs from a pattern of light, sound or vibration emitted from the notification part 40 in the normal condition. In addition, it is preferable that the pattern of light, sound or vibration emitted from the notification part 40 to notify that the power supply 10 has been degraded differs from a pattern of light, sound or vibration emitted from the notification part 40 in a case where a value of the second timer exceeds a second predetermined time period described later.

In step S420, when the value of the first timer does not exceed the first predetermined time period, the controller 51 determines whether to have detected the end of the charging (step S426). The controller 51 detects the end of the charging by detecting that the connection of the charger 200 has been released, for example. Alternatively, the controller 51 may detect the end of the charging by detecting that a charging current from the charger 200 has been stopped, for example. When the controller 51 detects the end of the charging, the controller 51 stops the charging while the switch 140 remains in an off state (step S430).

When the controller 51 does not detect the end of the charging, the controller 51 determines whether the value of the second timer exceeds the second predetermined time period (step S428). The second predetermined time period may be set based on a time period required to charge, to the fully charged voltage, the power supply 10 whose charging capacity is reduced to the discharge termination voltage. The second predetermined time period is shorter than the first predetermined time period. It is sufficient that the second predetermined time period is set to an appropriate value found by experiment in advance depending on the design of the power supply 10. The second predetermined time period may be, for example, 60 to 120 minutes.

When the value of the second timer exceeds the second predetermined time period, the controller 51 stops the charging of the power supply 10 while the switch 140 remains in an off state (step S430). Specifically, when the value of the second timer exceeds the second predetermined time period, the controller 51 forcibly stops the charging even when the charger 200 is attached to the battery unit 110. Thus, the controller 51 can prevent overcharge of the power supply 10.

When the value of the second timer exceeds the second predetermined time period, the controller 51 stops the charging of the power supply 10, and may notify the user of the stop of the charging by light, sound or vibration emitted from the notification part 40. It is preferable that a pattern of light, sound or vibration emitted from the notification part 40 to notify the stop of the charging differs from the pattern of light, sound or vibration emitted from the notification part 40 to notify that the power supply 10 has been degraded as described above.

When the time period elapsed from the charging start of the power supply 10 exceeds the second predetermined time period, the controller 51 maintains a state in which a count of the accumulated value of the connection time period to the charger, i.e., the first timer is stopped.

When the value of the second timer does not exceed the second predetermined time period, the controller 51 turns on the switch 140 again after a predetermined time period elapses, to repeat the charging of the power supply 10 (steps S432 and S406). The predetermined time period may be, for example, 300 μsec to 500 μsec. The predetermined time period may be a preset fixed value.

When the controller 51 turns on the switch 140, the controller 51 turns on the first timer and the second timer as described above (step S408 and step S410). Thus, the measurement values of the first timer and the second timer start to increase again. In this way, the controller 51 is configured to count the accumulated value of the connection time period to the charger 200 while the switch 140 is in an on state.

By repeating the above-described processes, the controller 51 periodically stops the charging to the power supply. For example, the controller 51 repeats the processes of charging for 80 msec to 120 msec and charging stop for 300 μsec to 500 μsec, for example.

Here, it is preferable that the controller 51 measures the accumulated value of the connection time period to the charger 200 without including the period during which the charging is periodically stopped. That is, the first timer may be stopped during a period during which the charging is periodically stopped. Similarly, the second timer may be also stopped during a period during which the charging is periodically stopped.

In addition to being illustrated in the above-described control flow, the controller 51 may forcibly stop the charging of the power supply 10 by electrically disconnecting from the power supply 10 in the battery unit 110. When the controller 51 stops the charging, it is preferable that the controller 51 stops a count of the first timer and/or the second timer. That is, it is preferable that the controller 51 measures the connection time period using the first timer and/or the second timer in a state in which the charger 200 is connected to the battery unit 110 and in a state in which the charger 200 and the power supply 10 are electrically connected to each other in the battery unit 110.

In the above-described control flow (FIG. 11), the two timers, i.e., the first timer and the second timer are used. Alternatively, the similar control flow can be performed without use of the first timer. In this case, steps S408 and S416 illustrated in FIG. 11 are unnecessary, and the accumulated value of the connection time period to the charger 200 is measured using the measurement value of the second timer. Since the second timer can measure the time period required for one charging process, the measurement value of the second timer is accumulated for each charging process so that the accumulated value of the connection time period to the charger 200 can be measured. Furthermore, in this case, an accumulated value (T1) of the connection time period to the charger 200 can be calculated during the charging process by adding the connection time period (a value of the second timer) elapsed in the present charging process to the accumulated value of the connection time period to the charger 200 which is obtained by accumulating the connection time period in the previous charging process. Thus, the degradation of the power supply 10 can be determined by performing the determination in step S420 using the accumulated value (T1) of the connection time period to the charger 200 that is thus calculated.

As illustrated in the control flow described above, when the accumulated value (T1) of the connection time period to the charger 200 exceeds the first predetermined time period during the charging process, it is preferable that the controller 51 determines that the power supply 10 has been degraded and stops the charging of the power supply. This can prevent the charging operation with respect to the degraded power supply 10.

(Control 2 by Control Unit in Charging Mode)

Figure 12:
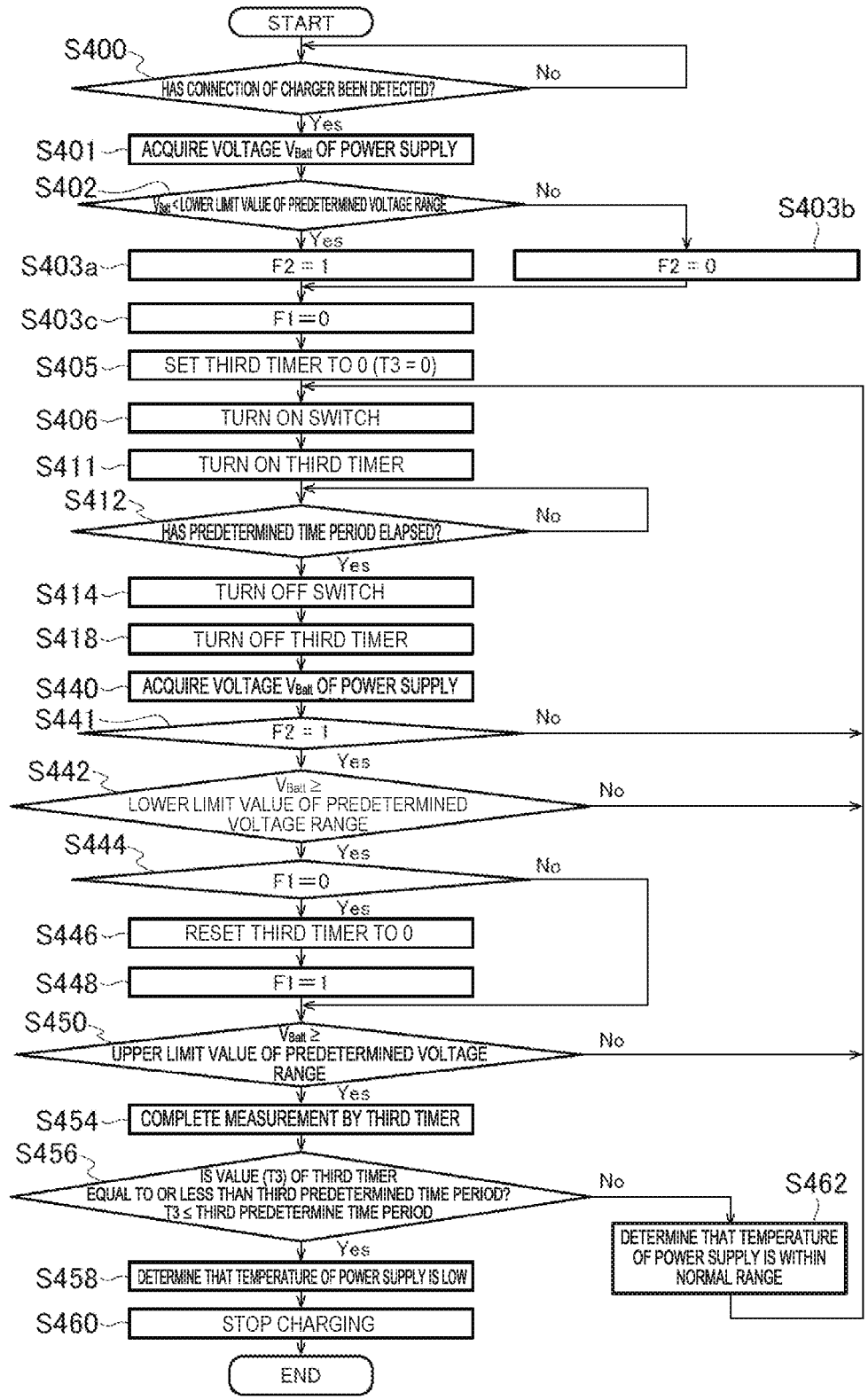
FIG. 12 is a flowchart illustrating another example of a control method by the controller in a charging mode.
Figure 13:
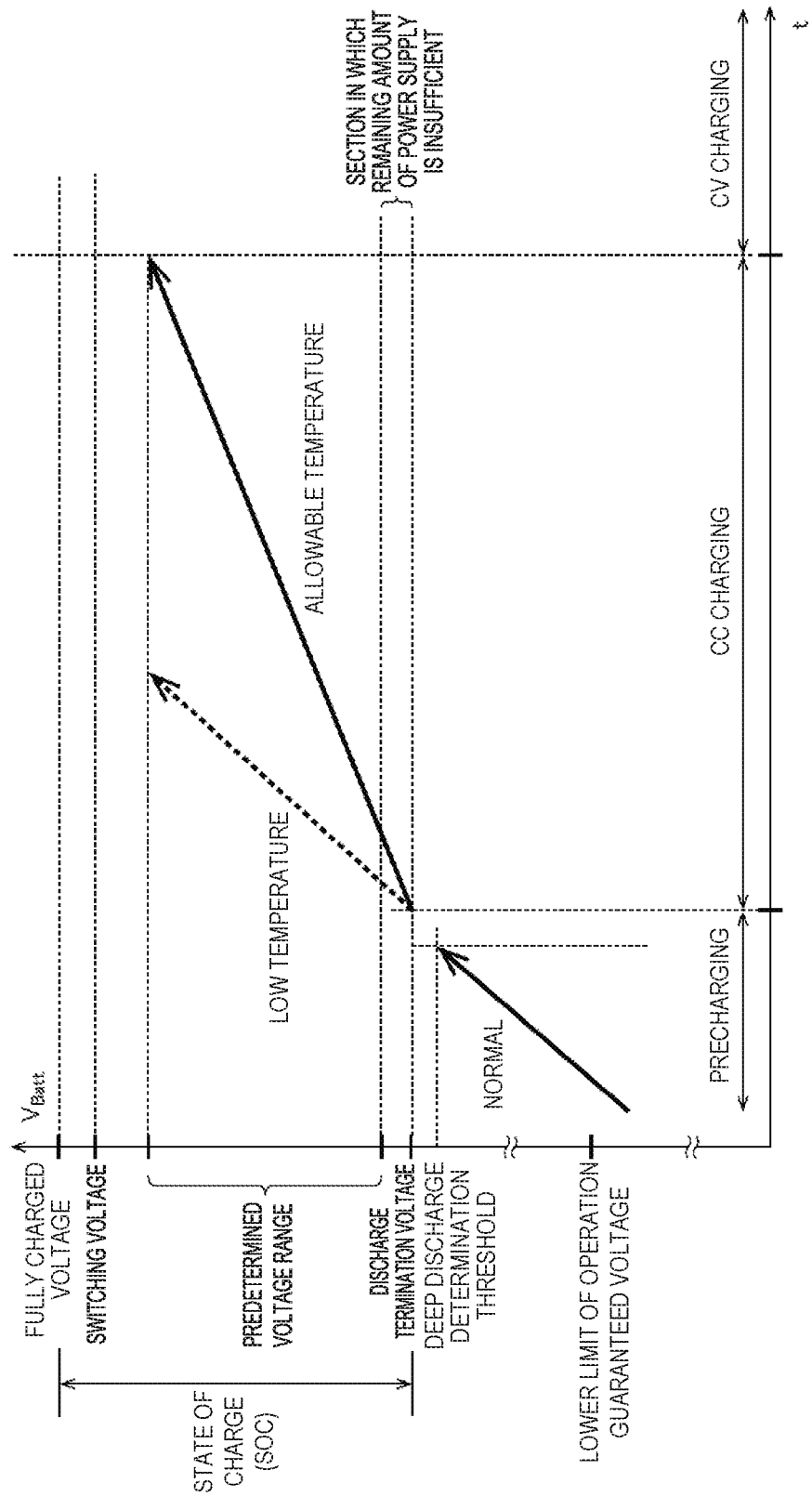
FIG. 13 is a graph showing a relationship between a charging time period of the power supply and a voltage of the power supply.
Figure 14:
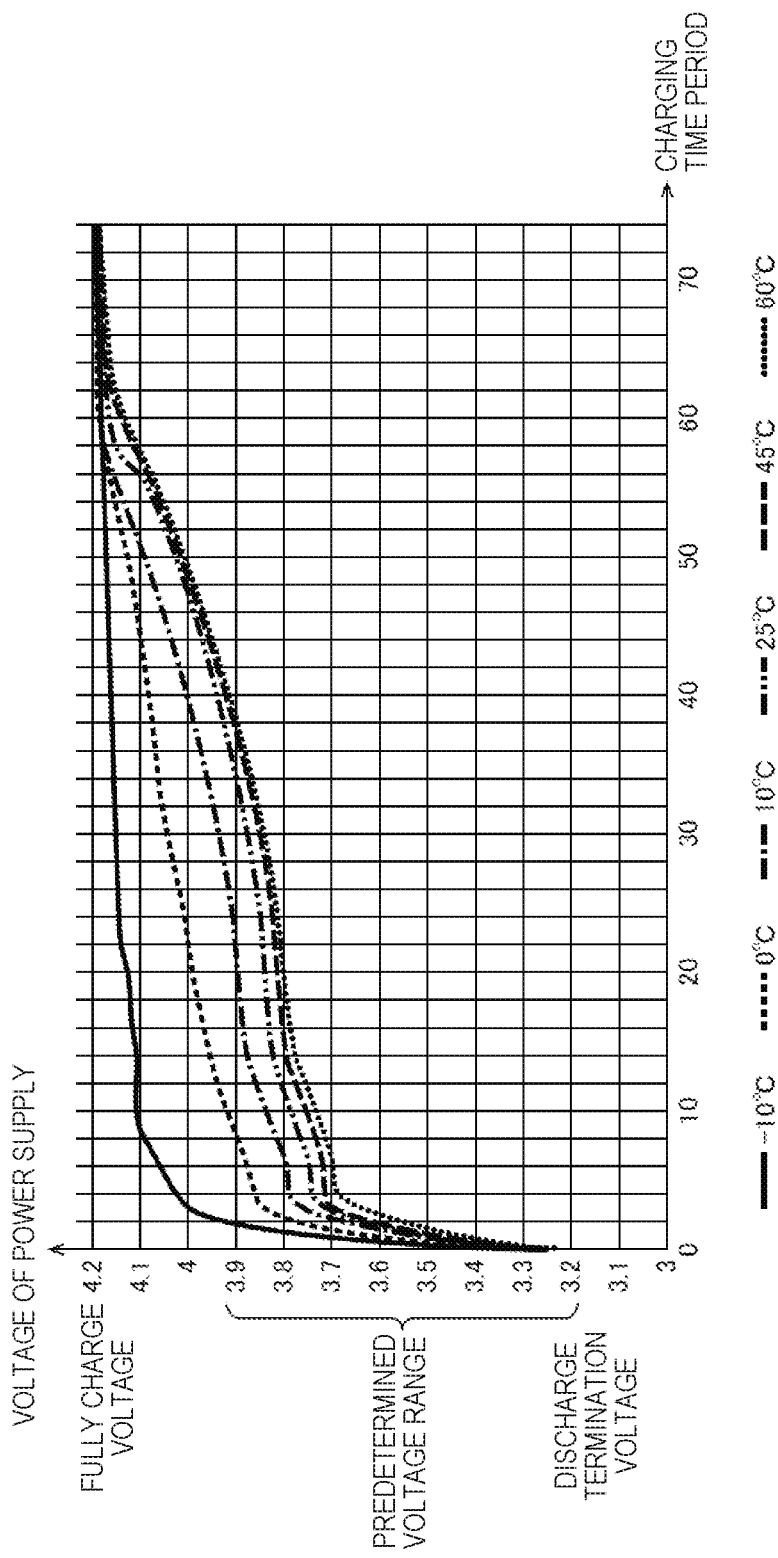
FIG. 14 is a graph showing temperature dependence of the relationship between a charging time period of the power supply and a voltage of the power supply.

FIG. 12 is a flowchart illustrating another example of a control method by the controller in a charging mode. FIG. 13 is a graph showing a relationship between a charging time period of the power supply and a voltage of the power supply. FIG. 14 is a graph showing temperature dependence of the relationship between a charging time period of the power supply and a voltage of the power supply.

An allowable temperature range of the power supply during the charging is typically defined for the power supply 10 such as a lithium ion secondary battery. This allowable temperature range differs depending on the type of the power supply 10, but may be defined in a range of 0 to 45° C., for example. In the control flow according to the present example, the controller 51 detects the temperature abnormality of the power supply 10 based on the voltage of the power supply 10 during the charging process of the power supply 10.

Firstly, the controller 51 detects the connection of the charger 200 to the battery unit 110 (step S400). When the controller 51 detects the connection of the charger 200 to the battery unit 110, the controller 51 acquires a voltage ($V_{batt}$) of the power supply 10 (step S401). It is preferable that the voltage of the power supply 10 is an open circuit voltage (OCV) acquired in a state in which the power supply 10 and the charger 200 are not electrically connected to each other.

Next, when the voltage of the power supply 10 is lower than a lower limit value (a first predetermined value) of a predetermined voltage range, a second flag is set to "1" (F2=1) (steps S402, and S403a). When the voltage of the power supply 10 is equal to or higher than the lower limit value of the predetermined voltage range, the second flag is set to "0" (F2=0) (steps S402, and S403b). That is, the second flag is an index for determining whether the voltage of the power supply 10 is lower than the lower limit value (the first predetermined value) of the predetermined voltage range at a charging start of the power supply 10. The lower limit value (the first predetermined value) of the predetermined voltage range will be described later.

When the controller 51 detects the connection of the charger 200 to the battery unit 110, the controller 51 sets a first flag to "0" (F1=0) and sets a third timer to "0" (steps S403c and S405). The third timer measures a time period required for the voltage of the power supply 10 to reach the second predetermined value from the first predetermined value (described later) during the charging.

Next, the controller 51 turns on the switch 140 (step S406). Thus, the charger 200 and the power supply 10 are electrically connected to each other. Accordingly, the charging of the power supply 10 is started. When the controller 51 turns on the switch 140, the controller 51 turns on the third timer (step S411). A measurement value of the third timer starts to increase.

When a predetermined time period has elapsed since turning on of the switch 140, the controller 51 turns off the switch (steps S412 and S414). The length of the elapsed predetermined time period is not limited to a particular length, but may be, for example, 80 msec to 120 msec.

When the controller 51 turns off the switch 140, the controller 51 stops the third timer (step S419). That is, the third timer may be stopped while the power supply 10 and the charger 200 are electrically disconnected from each other in the battery unit.

The controller 51 acquires the voltage of the power supply 10 in a state in which the switch 140 is in an off state (step S440). The voltage of the power supply 10 can be acquired by the voltage sensor 150. It is preferable that the voltage of the power supply 10 is an open circuit voltage (OCV) acquired in a state in which the power supply 10 and the charger 200 are not electrically connected to each other. Alternatively, the voltage of the power supply 10 may be a closed circuit voltage (CCV) acquired in a state in which the power supply 10 and the charger 200 are electrically connected to each other. In this case, the voltage of the power supply 10 is acquired before the switch 140 is turned off in step S414.

From the viewpoint of the accuracy of the voltage of the voltage of the power supply 10, it is preferable that the voltage of the power supply 10 is defined by the open circuit voltage (OCV) rather than by the closed circuit voltage (CCV) to eliminate the influences of voltage drop, internal resistance and temperature change.

From the viewpoint of the accuracy of the voltage of the voltage of the power supply 10, it is preferable that the voltage of the power supply 10 is defined by the open circuit voltage (OCV) rather than by the closed circuit voltage (CCV) to eliminate the influences of voltage drop, internal resistance and temperature change.

Next, when the second flag is "0" (F2=0), the process returns to step S406, and the switch 140 is turned on again to repeat the charging of the power supply 10 (step S441). That is, when the voltage of the power supply 10 is equal to or higher than the lower limit value (the first predetermined value) of the predetermined voltage range at the start of the charging, the controller 51 continues the charging of the power supply 10 without performing the detection of the temperature abnormality described later. Note that although not specified in the flowchart of FIG. 12, when the controller 51 detects the end of the charging, the controller 51 may forcibly stop the charging by, for example, turning off the switch 140, in a similar manner to step S426 of FIG. 11.

In step S441, when the second flag is "1" (F2=1), the controller 51 determines whether the voltage ($V_{batt}$) of the power supply 10 is equal to or higher than the lower limit value (the first predetermined value) of the predetermined voltage range (step S442). The first predetermined value may be in a range from the discharge termination voltage to a voltage higher than the discharge termination voltage by about 0.1 V. Preferably, the first predetermined value is the discharge termination voltage.

When the voltage of the power supply 10 is lower than the lower limit value of the predetermined voltage range, the controller 51 turns on the switch 140 again after a predetermined time period elapses, to repeat the charging of the power supply 10 (steps S442 and S406). The predetermined time period may be, for example, 300 µsec to 500 µsec. The predetermined time period may be a preset fixed value.

When the voltage of the power supply 10 is equal to or higher than the lower limit value of the predetermined voltage range and the value of the first flag (F1) is "0," the controller 51 resets the third timer to restart the timer (step S446). Here, the first flag (F1) indicates whether the voltage of the power supply 10 has ever been equal to or higher than the lower limit value of the predetermined voltage range. When F1=0, it indicates that the voltage of the power supply 10 has never been equal to or higher than the lower limit value of the predetermined voltage range. That is, when the voltage of the power supply 10 is equal to or higher than the lower limit value of the predetermined voltage range for the first time, the controller 51 resets the third timer. When the controller 51 resets the third timer and restarts the third timer, the controller 51 changes the first flag (F1) to "1" to indicate that the voltage of the power supply 10 has ever been equal to or higher than the lower limit value of the predetermined voltage range (step S448).

When the voltage of the power supply 10 is equal to or higher than the lower limit value of the predetermined voltage range and the value of the first flag (F1) is "1," the process proceeds to step S450 without reset of the third timer. In step S450, the controller 51 determines whether the voltage of the power supply 10 is equal to or higher than an upper limit value (a second predetermined value) of the predetermined voltage range (step S450).

The second predetermined value is larger than the above-described first predetermined value and smaller than the fully charged voltage. It is preferable that the second predetermined value is smaller than the above-described switching voltage. The second predetermined value may be, for example, in a range of 3.8 V to 4.0 V.

When the voltage of the power supply 10 is lower than the upper limit value of the predetermined voltage range, the controller 51 turns on the switch 140 again after the above-described predetermined time period elapses, to repeat the charging of the power supply 10 (steps S450 and S406).

When the voltage of the power supply 10 is equal to or higher than the upper limit value of the predetermined voltage range, the controller 51 ends the measurement of the time period by the third timer (step S454). Thus, the third timer measures the charging time period required for the voltage of the power supply 10 to reach the upper limit value (the second predetermined value) from the lower limit value (the first predetermined value) of the predetermined voltage range.

Next, the controller 51 determines whether a value of the third timer is equal to or less than a third predetermined time period (step S456). That is, the controller 51 determines whether the charging time period required for the voltage of the power supply 10 to reach the upper limit value (the second predetermined value) from the lower limit value (the first predetermined value) of the predetermined voltage range is equal to or less than the third predetermined time period. The third predetermined time period will be described later.

When the charging time period required for the voltage of the power supply 10 to reach the upper limit value (the second predetermined value) from the lower limit value (the first predetermined value) of the predetermined voltage range is equal to or less than the third predetermined time period, the controller 51 detects the abnormality. Specifically, the controller 51 determines that the temperature of the power supply 10 is abnormal, in particular, the temperature of the power supply 10 is less than the allowable temperature range, and stops the charging process of the power supply 10 (steps S458 and S460).

The stop of the charging process may be, for example, a forcible stop or limit of the charging by the controller 51. The forcible stop or limit of the charging can be achieved by disconnecting the electrical connection between the power supply 10 and the charger 200 in the battery unit 110. For example, to disconnect the electrical connection, it is only required that the controller 51 turns off the switch 140. Alternatively, the electrical connection may be also disconnected by switching the disconnection means 170 to the first mode to temporarily disable the electrical connection between the charger 200 and the power supply 10.

When the controller 51 detects the temperature abnormality of the power supply 10, the controller 51 may notify the user of the abnormality through the notification part 40. Specifically, the controller 51 may notify the user of the abnormality by light, sound or vibration emitted from the notification part 40. It is preferable that a pattern of light, sound or vibration emitted from the notification part 40 at this time differs from the pattern of light, sound or vibration emitted from the notification part 40 in the normal condition and a pattern to notify that the power supply 10 has been degraded in the control flow illustrated in FIG. 11.

When the charging time period required for the voltage of the power supply 10 to reach the upper limit value (the second predetermined value) from the lower limit value (the first predetermined value) of the predetermined voltage range is larger than the third predetermined time period, the controller 51 determines that the temperature of the power supply 10 is within a normal range, and turns on the switch 140 again to repeat the charging of the power supply 10 (steps S462 and S406).

According to the above-described control flow, the controller 51 detects the abnormality based on the charging time period required for the voltage of the power supply 10 to reach the upper limit value (the second predetermined value) from the lower limit value (the first predetermined value) of the predetermined voltage range, during the charging process of the power supply 10. Here, the controller 51 is configured to periodically stop the charging to the power supply 10 (step S414). It is preferable that, as indicated in the above-described flow, the controller 51 measures the charging time period without including the time period during which the charging is periodically stopped. Alternatively, the controller 51 may measure the charging time period, including the period during which the charging is periodically stopped.

In the above-described embodiment, the value of the second flag (F2) is set based on the voltage of the power supply 10 acquired when the charging mode is started (steps S401, S402, S403a, and S403b). Alternatively, the value of the second flag (F2) at the start of the charging may be set based on the voltage of the power supply 10 acquired in the power supply mode (see FIG. 8) (steps S402, S403a, and S403b). That is, when the voltage of the power supply 10 acquired lastly in the power supply mode becomes the lower limit value of the predetermined voltage range, preferably the discharge termination voltage, for example, 3.2 V or lower, the second flag may be set to "1" (F2=1).

In the control flow illustrated in FIG. 12, the third timer is configured to measure the time period from when the voltage of the power supply 10 exceeds the lower limit value of the predetermined voltage range to when the voltage of the power supply 10 reaches the upper limit value of the predetermined voltage range. Therefore, steps S402, S444 and S446 are provided for the first flag (F1) for determining the timing at which the voltage of the power supply 10 exceeds the lower limit value of the predetermined voltage range.

Alternatively, steps S402, and S442 to 448 illustrated in FIG. 12 may be unnecessary. That is, when the second flag is "1" (F2=1) in the charging mode, the measurement of the third timer is started (step S406), and the third timer measures the time period required for the voltage of the power supply 10 to reach the upper limit of the predetermined voltage range. That is, when the voltage of the power supply 10 at the start of the charging mode is lower than the lower limit value of the predetermined voltage range, e.g., the discharge termination voltage, the measurement of the third timer is started, and the third timer measures the time period required for the voltage of the power supply 10 to reach the upper limit value of the predetermined voltage range. Even in such a case, in step S456, the controller 51 can determine the temperature abnormality of the power supply 10.

According to this method, the measurement of the time period is started from when the charging mode is started, and therefore the controller 51 can determine the temperature of the power supply 10 in step S456 using the second timer illustrated in FIG. 11. That is, the control flow can be performed in which the controller 51 determines the temperature abnormality of the power supply 10 using the above-described second timer instead of the third timer illustrated in FIG. 12.

However, when the power supply 10 is deeply discharged, the charger 200 charges the power supply 10 with low-rate power (step S304), and therefore it is preferable that steps S402 and S442 to 448 illustrated in FIG. 12 are performed so that the charging period with a low rate is not counted as the time period measured by the third timer.

In the above-described embodiment, the controller 51 detects the abnormality based on the charging time period required for the voltage of the power supply 10 to reach the upper limit value (the second predetermined value) from the lower limit value (the first predetermined value) of the predetermined voltage range during the charging process of the power supply 10. The controller 51 can also detect the abnormality using the value related to a remaining amount of the power supply 10 instead of the voltage of the power supply. For example, the controller 51 may detects the temperature abnormality of the power supply 10 based on the charging time period required for the remaining capacity or state of charge (SOC) of the power supply 10 to reach the upper limit value (the second predetermined value) from the lower limit value (the first predetermined value) of the predetermined range during the charging process of the power supply 10. In this case, in step S440 described above, the controller 51 acquires the value related to the remaining amount of the power supply 10, e.g., the remaining capacity or state of charge of the power supply 10, instead of acquiring the voltage of the power supply 10.

In this case, the first predetermined value may be in a range from a value related to the remaining amount of the power supply 10 corresponding to the discharge termination voltage to a value related to the remaining amount of the power supply 10 corresponding to a voltage higher than the discharge termination voltage by about 0.1 V. Preferably, the first predetermined value is a value related to the remaining amount of the power supply 10 corresponding to the discharge termination voltage. The second predetermined value is larger than the above-described first predetermined value and smaller than the value related to the remaining amount of the power supply 10 corresponding to the fully charged voltage. It is preferable that the second predetermined value is smaller than a value related to the remaining amount of the power supply 10 corresponding to the above-described switching voltage. The second predetermined value may be in a range of a value related to the remaining amount of the power supply 10 corresponding to, for example, 3.8 V to 4.0 V.

Here, the remaining capacity or state of charge (SOC) of the power supply 10 can be acquired using any known method. For example, it is known that the remaining capacity or state of charge (SOC) of the power supply 10 has a correlation with the voltage of the power supply 10. Accordingly, the remaining capacity or state of charge (SOC) of the power supply 10 can be estimated based on the voltage of the power supply 10 using the correlation between the remaining capacity or state of charge (SOC) of the power supply 10 and the voltage of the power supply 10. That is, the controller 51 may acquire the voltage of the power supply 10 in a period during which the charging to the power supply 10 is periodically stopped, and derive the value related to the remaining amount of the power supply 10 based on the acquired voltage of the power supply 10. Note that since the correlation between the remaining capacity or state of charge (SOC) of the power supply 10 and the voltage of the power supply 10 is determined depending on the design of the power supply 10, the correlation can be determined by experiment in advance.

Here, as shown in FIG. 13 and FIG. 14, as the temperature of the power supply 10 during the charging is lower, the voltage of the power supply 10, i.e., the state of charge (SOC) of the power supply 10 increases rapidly in the initial state of the charging. This tendency is based on an increase in internal resistance accompanied by the temperature decrease, and does not depend on the type of power supply 10. Accordingly, when the charging time period required for the value related to the remaining amount of the power supply 10 to reach the upper limit value (the second predetermined value) from the lower limit value (the first predetermined value) of the predetermined range during the charging process of the power supply 10 is equal to or less than the third predetermined time period, the controller 51 can detect the abnormality of the temperature of the power supply 10. This method can be used to detect the temperature abnormality of the power supply 10 during the charging, without use of the temperature sensor.

The third predetermined time period is set so that the temperature lower than the allowable temperature range of the power supply 10 can be detected according to the lower limit value (the first predetermined value) and the upper limit value (the second predetermined value) of the predetermined range. The third predetermined time period can be set to a predetermined value by experiment in advance, on the condition that the lower limit value (the first predetermined value) and the upper limit value (the second predetermined value) of the predetermined range are determined. The third predetermined time period is a time period shorter than each of the above-described first predetermined time period and second predetermined time period.

For example, FIG. 14 shows experiment data obtained in the lithium ion secondary battery. In consideration of a slight error or buffer for the allowable temperature ranges of various types of lithium ion secondary batteries, when the temperature of the power supply 10 is, for example, 4° C. or lower, preferably, 0° C. or lower, the temperature is regarded as the temperature abnormality of the power supply. Here, when the first predetermined value is defined by the discharge termination voltage (3.2 V) and the second predetermined value is defined by 3.9 V, the third predetermined time period may be preferably 8 minutes to 12 minutes based on the graph shown in FIG. 13.

(Control 3 by Control Unit in Charging Mode)

Figure 15:
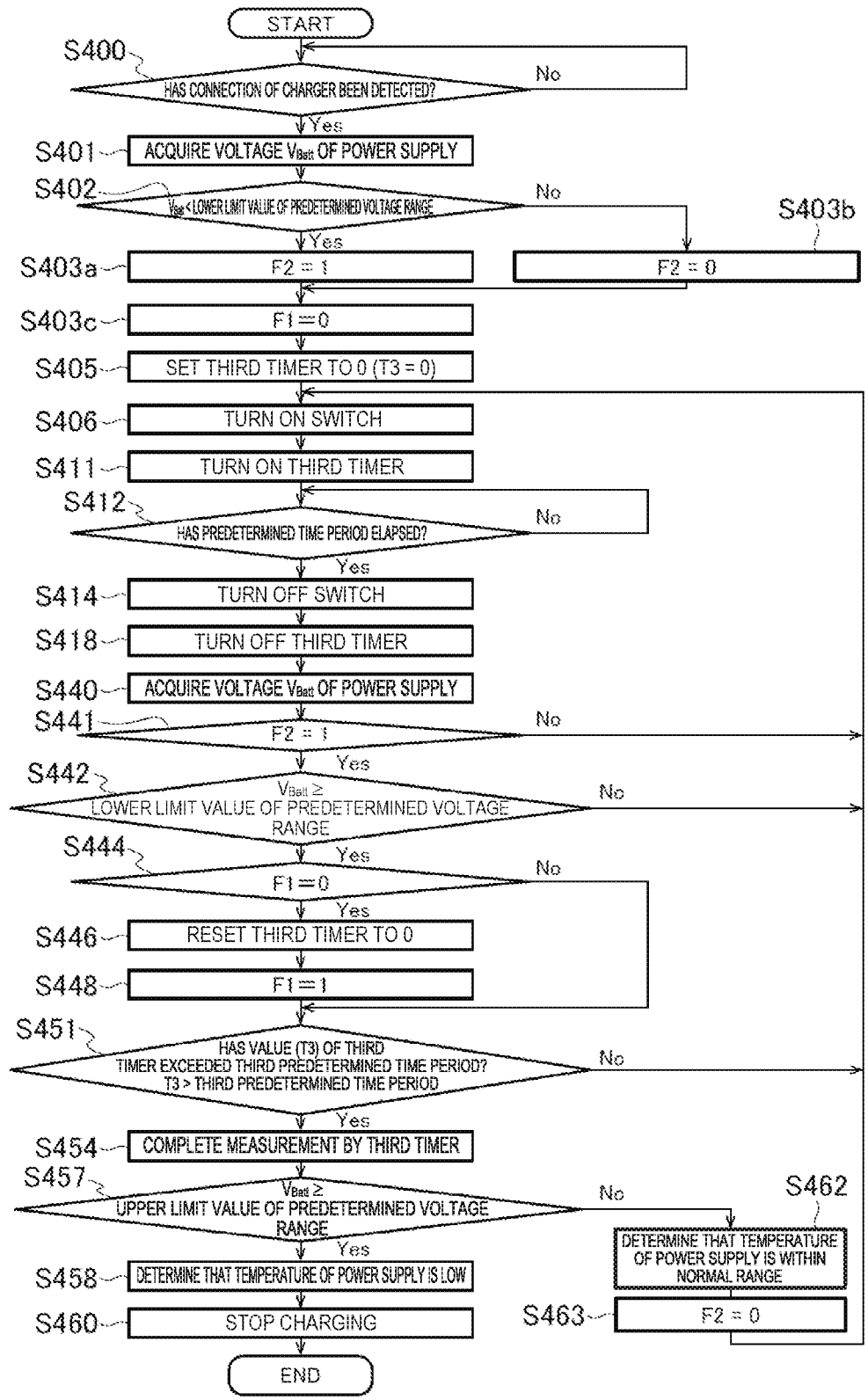
FIG. 15 is a flowchart illustrating yet another example of a control method by the controller in a charging mode.

FIG. 15 is a flowchart illustrating yet another example of a control method by the controller in the charging mode. FIG. 15 illustrates another method of detecting the temperature abnormality of the power supply 10 during the charging that is a method other than the method described using FIG. 12. In this aspect, steps S400 to S448 are as described above, and the description thereof is omitted (see FIG. 12).

In this aspect, step S451 is performed instead of step S450 illustrated in FIG. 12. In step S451, the controller 51 determines whether the value of the third timer exceeds the third predetermined time period (step S451). Here, the third timer counts the time period that has elapsed since the voltage of the power supply 10 reached the lower limit value of the predetermined voltage range. Accordingly, in step S451, the controller 51 determines whether the third predetermined time period has elapsed since the voltage of the power supply 10 reached the lower limit value of the predetermined voltage range. Here, the third predetermined time period may be similar to that described in FIG. 12.

When the value of the third timer is equal to or less than the third predetermined time period, the controller 51 turns on the switch 140 (step S406) to continue the charging of the power supply 10.

When the value of the third timer exceeds the third predetermined time period, the controller 51 ends the measurement of the time period by the third timer (step S454). Next, the controller 51 determines whether the voltage ($V_{batt}$) of the power supply 10 is equal to or higher than the upper limit value (the second predetermined value) of the predetermined voltage range (step S457). Here, the upper limit value (the second predetermined value) of the predetermined voltage range is as described above. It is preferable that the second predetermined value is smaller than the above-described switching voltage, and may be, for example, in a range of 3.8 V to 4.0 V.

When the voltage ($V_{batt}$) of the power supply 10 is equal to or higher than the upper limit value (the second predetermined value) of the predetermined voltage range, the controller 51 detects the abnormality. Specifically, the controller 51 determines that the temperature of the power supply 10 is abnormal, in particular, the temperature of the power supply 10 is less than the allowable temperature range, and stops the charging process of the power supply 10 (steps S458 and S460).

When the voltage ($V_{batt}$) of the power supply 10 is lower than the upper limit value (the second predetermined value) of the predetermined voltage range, the controller 51 determines that the temperature of the power supply 10 is within a normal range, and turns on the switch 140 again to repeat the charging of the power supply 10 (steps S462 and S406). At this time, for example, the second flag is set to "0" (F2=0) (step S463), so that the charging can be continued without the determination of the temperature abnormality being performed again based on step S457 in the subsequent charging period.

According to the above-described control flow, the controller 51 can detect the temperature abnormality of the power supply based on the voltage of the power supply 10 when the predetermined charging time period has elapsed since the voltage of the power supply 10 reached the lower limit value (the first predetermined value) of the predetermined voltage range during the charging process of the power supply 10.

The controller 51 can also detect the abnormality using the value related to the remaining amount of the power supply 10 instead of the voltage of the power supply. For example, the controller 51 can detect the temperature abnormality of the power supply based on the value related to the remaining amount of the power supply 10 when the predetermined charging time period has elapsed since the value related to the remaining amount of the power supply 10 has become the lower limit value (the first predetermined value) of the predetermined range during the charging process of the power supply 10. In this case, as described above, the value related to the remaining amount of the power supply 10 may be, for example, the remaining capacity or state of charge (SOC) of the power supply 10.

Here, as shown in FIG. 14, as the temperature of the power supply 10 during the charging is lower, the voltage of the power supply 10, i.e., the state of charge (SOC) of the power supply 10 increases significantly in the predetermined charging period. Accordingly, the above-described method can be used to detect the temperature abnormality of the power supply 10 during the charging, without use of the temperature sensor.

(Program and Storage Medium)

The aforementioned flow illustrated in FIG. 8, FIG. 11, FIG. 12 and FIG. 15 can be performed by the controller 51. That is, the controller 51 may have a program that causes the battery unit 110 and/or the flavor inhaler 100 to execute the above-described method, and a storage medium in which the program is stored. Furthermore, the aforementioned flow illustrated in FIG. 10 can be performed by the external charger 200. That is, the external charger 200 may have a program that causes a system including the flavor inhaler 100 and the charger 200 to execute the above-described method, and a storage medium in which the program is stored.

OTHER EMBODIMENTS

Although the present invention has been described by the embodiments described above, it should not be understood that the descriptions and the drawings that form a part of this disclosure limit the present invention. Various alternative embodiments, examples and operation techniques will be apparent to those skilled in the art from this disclosure.

For example, in the above-described embodiments, "Control 1 by control unit in charging mode" and "Control 2 by control unit in charging mode" have been described as respective aspects different from each other. Alternatively, the controls 1 and 2 by the control unit in the charging mode may be simultaneously performed in parallel.

The invention claimed is:

1. A battery unit for a favor inhaler, comprising:
a chargeable and dischargeable power supply;
an interface configured to electrically connect to an external charger; and circuitry configured to perform control regarding at least the power supply, wherein
the circuitry is configured to
periodically stop charging to the power supply; and
measure an accumulated value of a connection time period to the charger without including a time period during which charging is periodically stopped,
in a case that the accumulated value of the connection time period to the charger exceeds a first predetermined time period, the circuitry is configured to determine that the power supply, has been degraded, and
the determination by the circuitry as to whether the power supply has been degraded is performed during a period when charging to the power supply is stopped.

2. The battery unit of claim 1, wherein
the circuitry is configured to stop a count of the accumulated value of the connection time period when a time period from a charging start of the power supply exceeds a second predetermined time period.

3. The battery unit of claim 1, further comprising:
a switch configured to electrically connect or disconnect between the charger and the power supply that are connected to the interface, wherein
the circuitry is configured to count the accumulated value of the connection time period to the charger while the switch is in an on state.

4. The battery unit of claim 1, wherein
the interface includes a pair of electrical terminals, and at least one of the pair of electrical terminals also serves as a terminal for detecting connection of the charger.

5. The battery unit of claim 1, wherein
the interface is configured to be electrically connectable to a load configured to vaporize or atomize an aerosol source or a flavor source.

6. The battery unit of claim 1, further comprising
a user interface configured to emit at least one of light, sound and vibration in a case that the accumulated value of the connection time period to the charger exceeds the first predetermined time period.

7. The battery unit of claim 1, further comprising:
a user interface configured to
emit a first pattern of at least one of light, sound and vibration in a case that the accumulated value of the connection time period to the charger exceeds the first predetermined time period; and
emit a second pattern of at least one of light, sound and vibration in a case that a time period from a charging start of the power supply exceeds a second predetermined time period, wherein the second pattern differs from the first pattern.

8. A charger configured to be connectable to the battery unit of claim 1.

9. A method for determining degradation of a chargeable and dischargeable power supply provided in a battery unit of a flavor inhaler, the method comprising:
controlling, by circuitry of the battery unit, charging to the power supply from an external charger;
periodically stopping, by the circuitry, charging to the power supply;
measuring, by the circuitry, an accumulated value of a connection time period of the power supply to the charger without including a time period during with charging periodically stopped; and
determining, by the circuitry, that the power supply has been degraded in a case that the accumulated value of the connection time period exceeds a first predetermined time period, wherein the determination by the circuitry as to whether the power supply has been degraded is performed during a period when charging to the power supply is stopped.

10. A non-transitory computer-readable medium including computer-program instructions, which when executed by circuitry, causes the circuitry to perform the method of claim 9.

* * * * *